United States Patent [19]

Nakagawa et al.

[11] Patent Number: 5,086,332
[45] Date of Patent: Feb. 4, 1992

[54] PLANAR SEMICONDUCTOR DEVICE HAVING HIGH BREAKDOWN VOLTAGE

[75] Inventors: Akio Nakagawa, Hiratsuka; Kiminori Watanabe, Kawasaki; Yutaka Koshino, Yokohama; Yoshihiro Yamaguchi, Urawa; Yoshiro Baba, Yokohama, all of Japan

[73] Assignee: Kabushiki Kaisha Toshiba, Kawasaki, Japan

[21] Appl. No.: 415,400

[22] Filed: Sep. 27, 1989

Related U.S. Application Data

[63] Continuation-in-part of Ser. No. 135,230, Dec. 21, 1987, abandoned.

[30] Foreign Application Priority Data

Dec. 26, 1986 [JP] Japan .................. 61-315301
Aug. 18, 1987 [JP] Japan .................. 62-203392

[51] Int. Cl.$^5$ .................................. H01L 27/02
[52] U.S. Cl. .................................. 357/51; 357/13; 357/23.8; 357/35; 357/36; 357/44; 357/52; 357/53; 357/57; 357/86; 357/89
[58] Field of Search .............. 357/13, 23.8, 35, 36, 357/41, 52, 53, 59, 86, 89

[56] References Cited

U.S. PATENT DOCUMENTS

| | | | |
|---|---|---|---|
| 4,270,137 | 5/1981 | Coe | 357/59 |
| 4,567,502 | 1/1986 | Nakagawa et al. | |
| 4,649,414 | 3/1987 | Ueda et al. | 357/59 |
| 4,707,719 | 11/1987 | Whight | 357/59 |

OTHER PUBLICATIONS

IEEE Trans. Electron Devices, vol. ED-23, No. 8, p. 826; T. Matsushita et al.; Aug. 1976.
1979 IEEE IEDM Technical Digest, p. 238; J. A. Appels et al.; Dec. 1979.
Trans IECE Japan, E69, p. 246, 1986; K. Watanabe et al.; Apr. 1986.

*Primary Examiner*—Edward J. Wojciechowicz
*Attorney, Agent, or Firm*—Oblon, Spivak, McClelland, Maier & Neustadt

[57] ABSTRACT

A planar semiconductor device having a high breakdown voltage includes a semiconductor layer of a first conductivity type and a first semiconductor region of a second conductivity type selectively formed, together with the semiconductor layer, in the surface of the semiconductor layer forming a pn junction. The first semiconductor region is formed to have an impurity concentration higher than that of the semiconductor layer and therefore a resistivity higher than that of the semiconductor layer. A second semiconductor region of the second conductivity type having an impurity concentration lower than that of the first semiconductor region, is formed around and in contact with the first semiconductor region and together with the semiconductor layer constitutes a pn junction. A high resistance film is formed at least over the first semiconductor region and the second semiconductor region. A voltage is applied across the high resistance film to create a uniform electric field in the high resistance film.

4 Claims, 20 Drawing Sheets

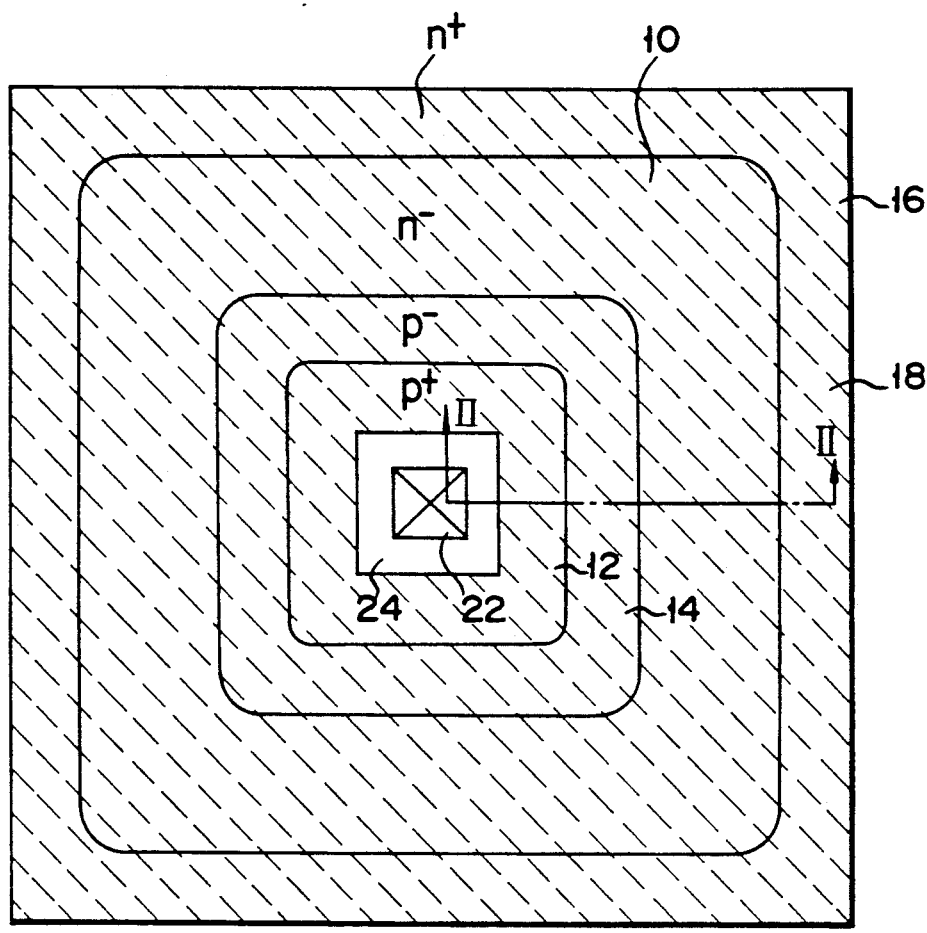
F I G. 1

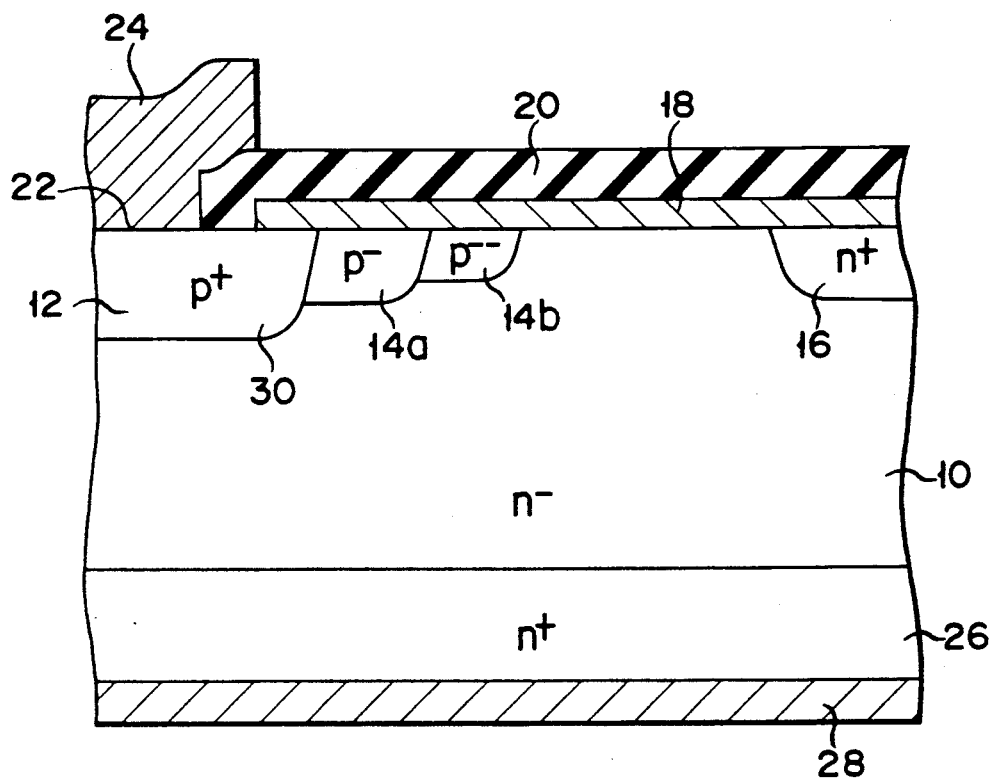
F I G. 4

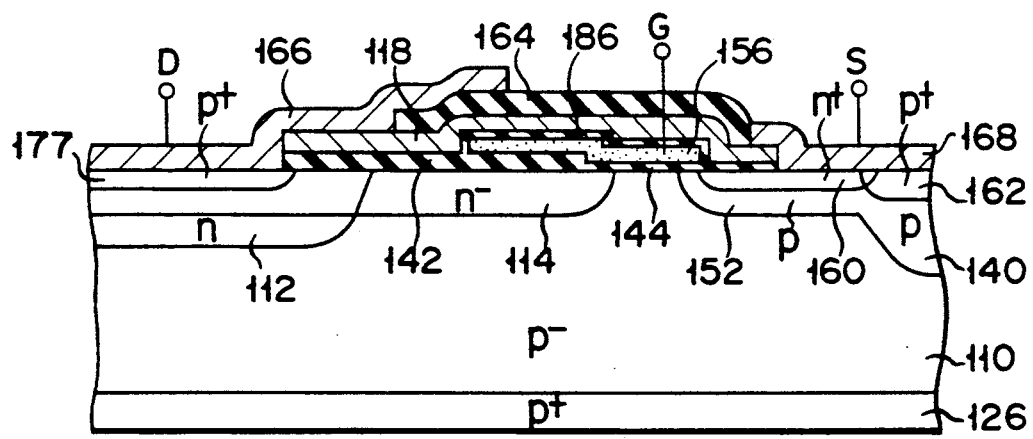
F I G. 18
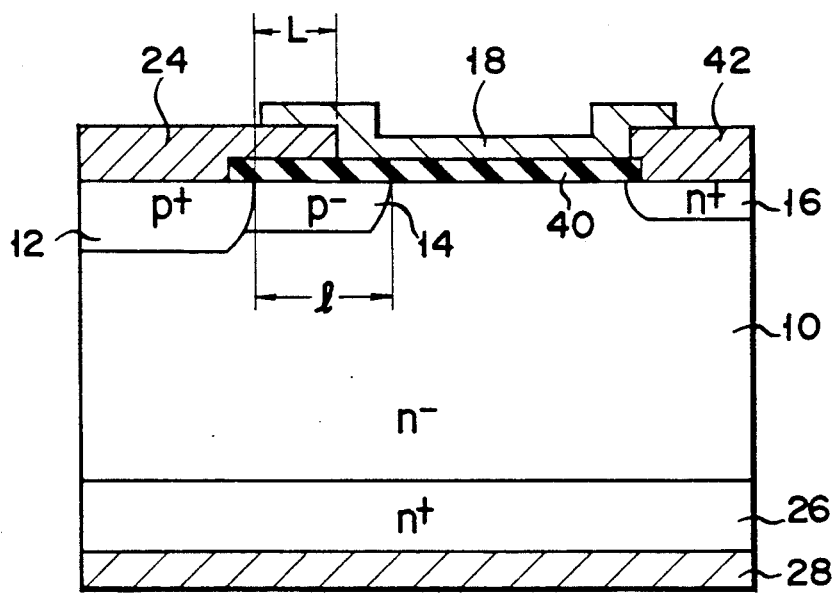
F I G. 19

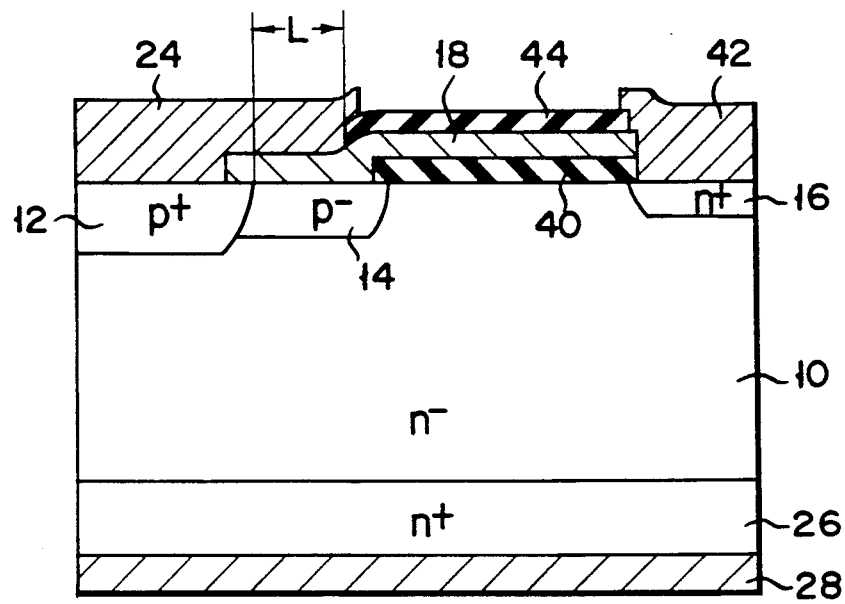
F I G. 24
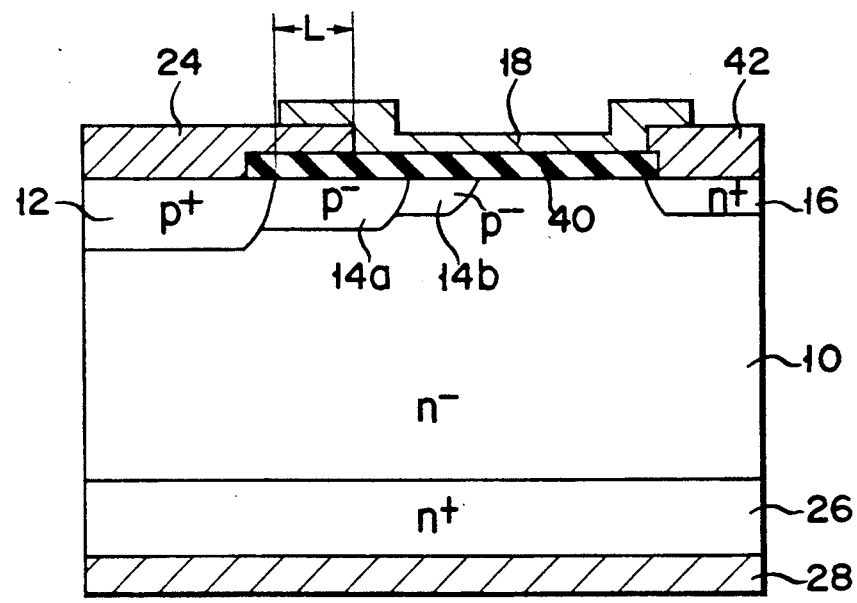
F I G. 25

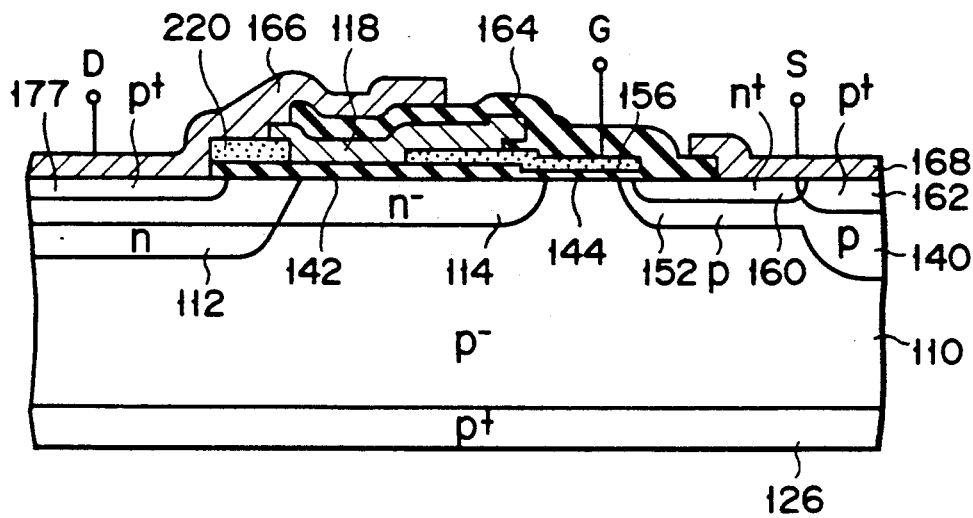
F I G. 31
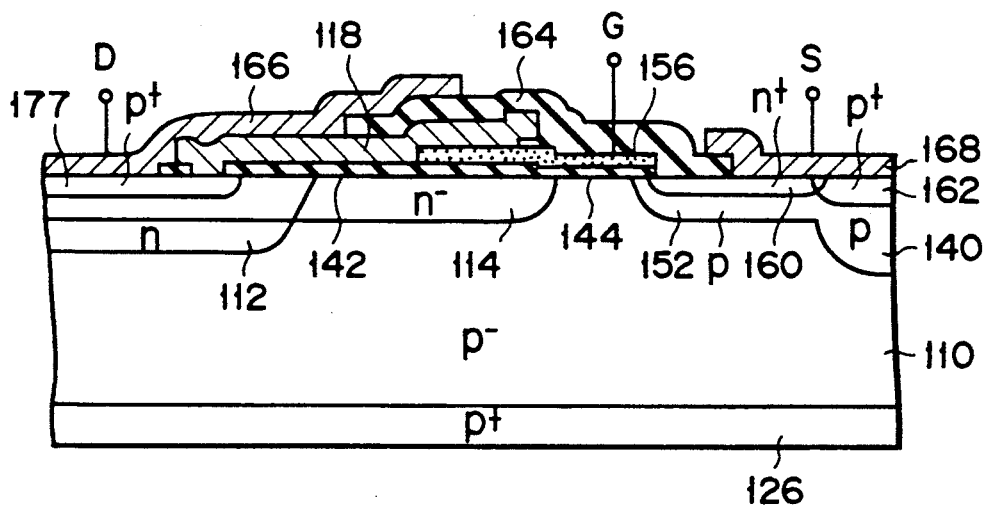
F I G. 32

PLANAR SEMICONDUCTOR DEVICE HAVING HIGH BREAKDOWN VOLTAGE

This invention is a continuation-in-part of application Ser. No. 07/135,230, filed on Dec. 21, 1987, now abandoned.

BACKGROUND OF THE INVENTION

This invention relates to a planar semiconductor device having high breakdown voltage.

A planar pn junction diode having high breakdown voltage is disclosed in "HIGH VOLTAGE THIN LAYER DEVICES (RESURF DEVICES)" by J. A. Appels et. al. in IEEE IEDM Technical Digest, December 1979, pp. 238-241. The device is constructed by using a so-called RESURF technology. With the device of this construction, A layer having high impurity concentration is surrounded by a layer having low impurity concentration with the same conductivity type as the low impurity concentration layer is formed to have an impurity concentration of approx. $2 \times 10^{12}/cm^2$ so as to provide an extremely high breakdown voltage.

Thus, the device can be formed to have high breakdown voltage, but when it is subjected to a BT test (Bias-temperature test) which is effected by application of reverse bias voltage at a high temperature, the breakdown voltage is deteriorated to a greater extent. It is understood that this may be caused by the movement of charges, particularly plus ions in a $SiO_2$ film covering the surface of the device. That is, when a reverse bias voltage is continuously applied at a temperature of approx. 150° C., a depletion layer is created in the semiconductor layer and a strong electric field is set up in the surface area of the semiconductor layer, moving the charges in the $SiO_2$ film and concentrating them into one place. As a result, the electric field is generated by the concentration of charges, resultantly intensifying the electric field in the depletion layer created near the surface of the semiconductor layer. Thus, the breakdown voltage is lowered.

Further, in this device, when the impurity concentration of the low impurity concentration layer surrounding the high impurity concentration layer is high, it becomes impossible to attain a high breakdown voltage. This is because the low impurity concentration layer surrounding the high impurity concentration layer is not completely depleted when the pn junction is reversely biased, and the electric field is concentrated at the curved portion of the pn junction with a small curvature. For this reason, the optimum value of the impurity concentration of the low impurity concentration layer is set to $2 \times 10^{12}$ to $4 \times 10^{12}/cm^2$. Thus, the range of the impurity concentration is set narrow, making small the allowance for dose amount used in the manufacturing process.

A device is known in which the electric field is prevented from being concentrated in the surface of the semiconductor layer by forming SIPOS (Semi-insulating Polycrystalline Silicon) directly on the surface of the semiconductor layer. Such a device is disclosed in, for example, "Highly Reliable High-Voltage Transistor by Use of the SIPOS Process" by T. MATSUSHITA et. al. in IEEE Trans. Electron Devices, Vol. ED-23, No. 8, August 1976 pp. 826-830. The SIPOS functions not only to prevent the concentration of electric filed but also to shield the semiconductor substrate from the external electric field.

Further, "Design Optimization of 1000V Resistive Field Plate" by K. WATANABE et al. in The Transactions of the IECE of Japan, Vol. E69, No. 4 April 1986 pp. 246-247 discloses the technology of forming a RFP (Resistive Field Plate) over the semiconductor layer through an oxidation film. In operation of the semiconductor device, a voltage applied to the semiconductor device is applied across the RFP to conduct a current therethrough, thus setting up a linear potential gradient in the RFP. With the RFP, the curvature of the depletion layer created in the surface area of the semiconductor layer can be made large, attaining a high breakdown voltage. Like the SIPOS, the inventors found that the RFP has an effect of shielding the external electric field. For example, wiring layers (i.e. interconnection metal layers) will be formed on the RFP in an IC device, but the RFP functions to shield the external electric field generated by the wiring layers, thus preventing the semiconductor substrate from being affected by the external electric field.

However, there still remains a problem that only 70% of the theoretical breakdown voltage determined by the semiconductor substrate or bulk can be attained when the SIPOS or RFP is used.

SUMMARY OF THE INVENTION

An object of this invention is to provide a planar semiconductor device having a high breakdown voltage and a low ON-resistance.

This object can be achieved by a planar semiconductor device comprising a semiconductor layer of a first conductivity type and a first semiconductor region of a second conductivity type opposite to the first conductivity type selectively formed in the surface area of the semiconductor layer to form a pn junction together with the semiconductor layer. The first semiconductor region has an impurity concentration higher than that of the semiconductor layer, and therefore, the semiconductor layer has a resistivity higher than that of the first semiconductor region. A second semiconductor region of the second conductivity type is formed around and in contact with the first semiconductor region to form a pn junction together with the semiconductor layer. It is not necessary that the second semiconductor region is in contact with the first semiconductor region. The second semiconductor region may be formed apart from said first semiconductor region to obtain the same advantages of this invention. The second semiconductor region has an impurity concentration lower than that or tne tIrst semiconductor region. A high resistance layer is formed over at least the first semiconductor region and the second semiconductor region which surrounds the first semiconductor region. In this case, the high resistance film can be formed directly on the first and second semiconductor regions or on an insulation layer formed between the high resistance layer and the first and second semiconductor regions. A voltage is applied across the high resistance layer to create a uniform electric field in the high resistance layer.

As described above, with the second semiconductor region of the low impurity concentration and the high resistance layer, the concentration of electric field in the semiconductor layer can be prevented. As a result, the breakdown voltage of the pn junction between the first semiconductor region and the semiconductor layer can be enhanced to more than 85% of the theoretical breakdown voltage of an ideal plane junction formed in a bulk. In contrast, when only the second semiconductor region of the low impurity concentration is formed, at most 75% of the theoretical breakdown voltage can be attained, and when only the high resistance layer is used, at most 70% of the theoretical breakdown voltage can be attained. Thus, according to this invention, a planar semiconductor device can be subjected to the BT test without deteriorating the breakdown voltage.

Further, in the semiconductor device of this invention, an electric field in portions such as wiring layers formed over the surface of the semiconductor layer can be prevented from being concentrated. Therefore, a leak current in the semiconductor device can be minimized.

With the semiconductor device having only the second semiconductor region formed therein, the optimum value of the impurity concentration of the second semiconductor region can be set to $2 \times 10^{12}$ to $4 \times 10^{12}/cm^2$. However, when the high resistance layer is formed a in this invention, the optimum value of the impurity concentration of the second semiconductor region can be set to $1.5 \times 10^{12}$ to $4.5 \times 10^{12}/cm^2$, thus enlarging the allowance for the formation of the second semiconductor region and enhancing the manufacturing yield of the semiconductor device. In other words, in order to attain the same breakdown voltage as in the prior art semiconductor device, the impurity concentration of the second semiconductor region can be made higher, and therefore the ON-resistance of the semiconductor device can be lowered.

Further, since the high resistance layer has a shield effect and functions to keep constant the internal potential distribution of the semiconductor device, the potential inside the semiconductor device will not be affected by electrodes or wiring layers formed over the surface of the semiconductor device. This eliminates the limitation on the shape of the electrodes and the patterns of the wiring layers, making it easy to attain a large operation current and high integration density of the semiconductor device.

In a preferable embodiment, the tips end of the contact portion of conductive film, which is connected to the high resistance layer to apply a voltage across the high resistance layer, are positioned in a range of 5 to 60 μm as measured from the boundary between the first and second semiconductor regions. With this construction, the breakdown voltage of the semiconductor device can be further enhanced.

If the resistivity of the high resistance film which is connected to the conductive film is set larger than $10^7$ Ω.cm, the contact portion of the high resistance film which is connected to the conductive film can also be used to function as a field plate, thus enhancing the breakdown voltage of the semiconductor device. Further, the contact portion is preferably positioned over the boundary between the first and second semiconductor regions. This is because this construction can effectively prevent the concentration of the electric field at the junction between the first and second semiconductor regions.

It is preferable that the high resistance film be formed of undoped semi-insulating polycrystalline silicon. The lifetime of carriers in the undoped semi-insulation polycrystalline silicon is shorter than that of majority carries in the doped semi-insulating polycrystalline silicon, and therefore charges accumulated at the time of switching the semiconductor device will rapidly disappear.

It is preferable that the silicon dioxide layer directly under the semi-insulating polycrystalline silicon film (or the high resistance film) has a thickness of greater than 1.0 μm in order to reduce the parasitic capacitance between the high resistance film and the semiconductor layer or region and to enhance device switching speed.

BRIEF DESCRIPTION OF THE DRAWINGS

Other objects and advantages will be apparent from the following description taken in conjunction with the accompanying drawings, in which:

FIG. 1 is a plan view of a planar semiconductor device according to a first embodiment of this invention;

FIG. 4 is a cross-sectional view of a planar semiconductor device according to a second embodiment of this invention;

FIG. 18 is a cross-sectional view of a planar semiconductor device according to an eleventh embodiment of this invention;

FIG. 19 is a cross-sectional view of a planar semiconductor device according to a twelfth embodiment of this invention;

FIG. 24 is a cross-sectional view of a planar semiconductor device according to a fifteenth embodiment of this invention;

FIG. 25 is a cross-sectional view of a planar semiconductor device according to a sixteenth embodiment of this invention.

FIG. 31 is a sectional view of a planar semiconductor device according to the twenty-first embodiment of the present invention;

FIG. 32 is a sectional view of a planar semiconductor device according to the twenty-second embodiment of the present invention;

DETAILED DESCRIPTION OF THE PREFERRED EMBODIMENTS

Figure 2:
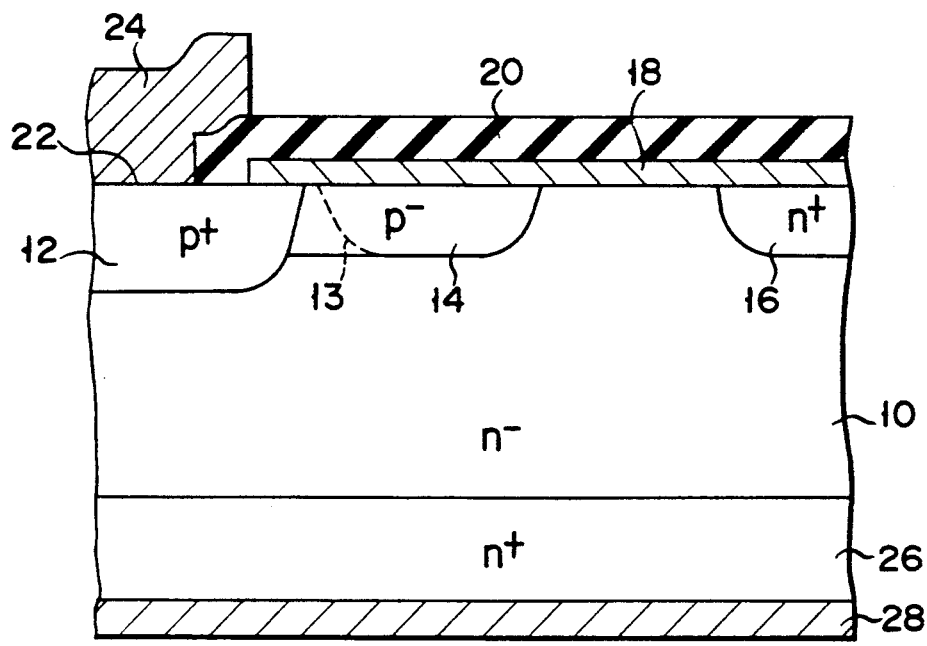
FIG. 2 is a cross-sectional view of FIG. 1 taken along line II—II.

There will now be described a planar semiconductor device according to a first embodiment of this invention with reference to FIGS. 1 to 3. The device of this embodiment is a pn junction diode. The diode includes $n^-$-type Si layer 10 of high resistivity used as a substrate and $p^+$-type region 12 of high impurity concentration which is formed in the surface area of Si layer 10 and used as an anode. A $p^-$-type region 14 of low impurity concentration is formed to surround $p^+$-type region 12. The total amount of impurity of $p^-$-type region 14 per unit area is $1.5 \times 10^{12}$ to $4.5 \times 10^{12}/cm^2$ as viewed from the surface. An $n^+$-type region 16 is formed in the peripheral portion of the diode element at a predetermined distance from $p^-$-type region 14. The function of stopping the extension of a depletion layer can be provided by means of $n^+$-type region 16. Semi-insulating polycrystalline silicon (SIPOS) film 18 serving as a high resistance film is formed in direct contact with the surface of the diode element to extend from $p^+$-type region 12 to $n^+$-type region 16. SIPOS film is formed as a high resistance film having a resistivity of more than $10^7$ $\Omega$.cm, preferably $10^7$ to $10^{12}$ $\Omega$.cm. The surface of the diode element is covered with $SiO_2$. Anode electrode 24 is formed in contact hole 22 formed in $SiO_2$ film 20. Further, $n^+$-type layer 26 is formed on the rear side of $n^-$-type layer 10 and cathode electrode 28 is formed on $n^+$-type layer 26.

The process of manufacturing the pn junction diode is explained. First, a substrate having $n^-$-type layer 10 formed on $n^+$-type layer 26 is prepared to form a semiconductor diode element. An $SiO_2$ film of 1 $\mu m$ is deposited on the surface of $n^-$-type layer 10, and a window for $p^+$-type layer 12 is formed in the $SiO_2$ film by the PEP process. Boron ion is injected into $n^-$-type layer 10 through the window at the rate of approx. $2 \times 10^{15}/cm^2$ by ion implantation technique to form $p^+$-type layer 12. Then, that portion of the $SiO_2$ film which lies around the window is etched out by the PEP process to form a second window which is approx. 180 $\mu m$ larger in a lateral direction than the former or first window. Boron ion is injected into $n^-$-type layer 10 through the second window at the rate of approx. $2 \times 10^{12}/cm^2$ to form $p^-$-type layer 14. Next, the $SiO_2$ film is further etched out by the PEP process to form a third window reaching the peripheral portion of the diode element. Then, a resist film is formed to cover the surface of $p^+$-type layer 12, $p^-$-type layer 14 and $n^-$-type layer 10, and phosphorus ion is injected into $n^-$-type layer 10 at the rate of $5 \times 10^{14}/cm^2$ to form $n^+$-type layer 16. Thereafter, an annealing process is effected for one hour, at a temperature of 1100° C. in a nitrogen atmosphere, and the impurity is subjected to diffusion in the atmosphere of $N_2:O_2=10:1$ until $p^+$-type layer 12 is diffused to a depth of 10 $\mu m$. Then, the $SiO_2$ film is removed and a semi-insulating polycrystalline silicon having a resistivity of more than $10^7$ $\Omega$.cm is deposited on the diode element to a thickness of 1 $\mu m$. The semi-insulating polycrystalline silicon layer is patterned to form semi-insulating polycrystalline silicon film 18 which extends from $p^+$-type layer 12 to $n^+$-type layer 16. Then, $SiO_2$ film 20 is formed on the entire surface of the diode element by the CVD method. A window is formed in $SiO_2$ film 20 and an Al film is formed by vapour deposition to form anode electrode 28.

It is not necessary that the second semiconductor region is in contact with the first semiconductor region. The second semiconductor region may be formed apart from said first semiconductor region, as shown in broken line 13 in FIG. 2, to obtain the same advantages of this embodiment.

Figure 3:
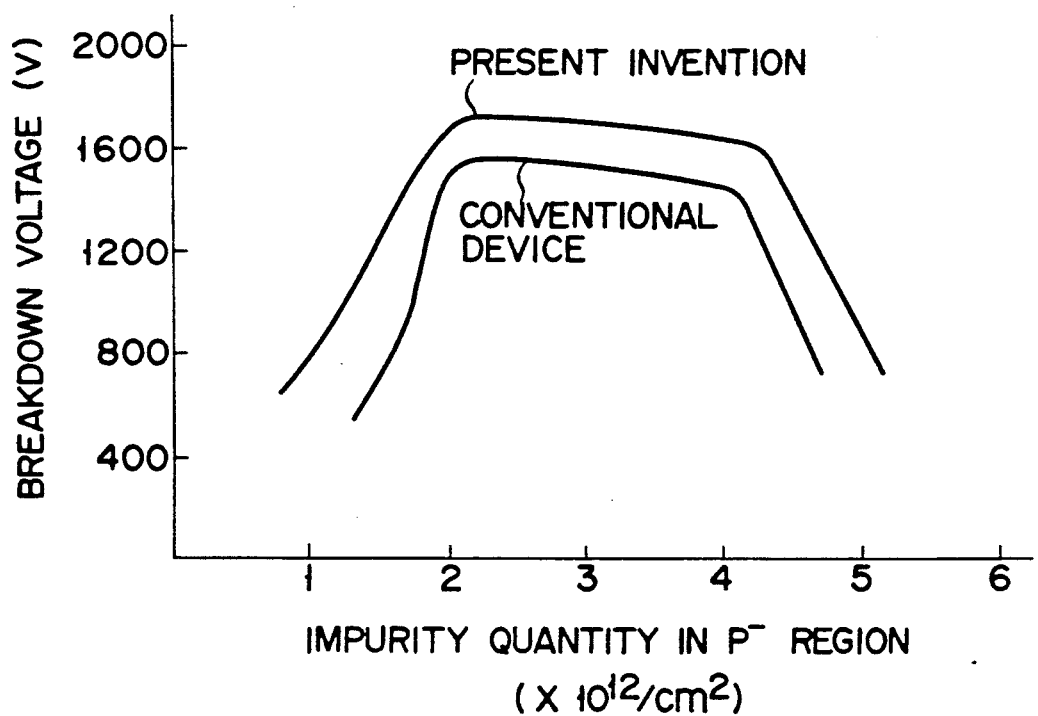
FIG. 3 is a diagram showing the relation between an impurity concentration of a $p^-$-type region and a breakdown voltage.

FIG. 3 shows the relation between the breakdown voltage and the impurity amount of $p^-$-type region 14 of the pn junction diode in comparison with the prior art case. In the prior art diode is similar to that of this embodiment except that semi-insulating polycrystalline silicon film 18 is not formed. The theoretical breakdown voltage of the pn junction diode when formed in the bulk form is 2000 V, but only 75% of the theoretical breakdown voltage can be attained in the prior art device. In contrast, in the embodiment of this invention, 85% of the theoretical breakdown voltage can be attained. On the other hand, if 70% or more of the theoretical breakdown voltage can be accepted, then the impurity amount of $p^-$-type region 14 of the device may be set to $1.5 \times 10^{12}$ to $4.5 \times 10^{12}/cm^2$. Thus, the allowance for the impurity amount of $p^-$-type region 14 can be made large, making it easy to manufacture the device.

One end of semi-insulating polycrystalline silicon film 18 is set at the same potential as that of $p^+$-type region 12 and the other end thereof is set at the same potential of that of $n^+$-type region 16. Therefore, when a reverse voltage is applied between $p^+$-type region 12 and $n^+$-type region 16, a small current flows through semi-insulating polycrystalline silicon film 18. The small current causes a uniform electric field to be created in semi-insulating polycrystalline silicon film 18. The uniform electric field prevents the concentration of electric field in $p^-$-type layer 14 and $n^-$-type layer 10. Therefore, a leakage current of the device will be prevented from being increased at a high temperature. When semi-insulating polycrystalline silicon film 18 is formed to have a sufficiently high resistance, the current value can be set sufficiently small so as not to affect the characteristics of the device. That is, the small current can be lowered to the same level as that of a leakage current flowing through the pn junction of a device in which no semi-insulating polycrystalline silicon film 18 is formed.

FIG. 4 shows a planar semiconductor device according to a second embodiment of this invention. This embodiment is similar to the first embodiment except that $p^-$-type region 14a is formed as a low impurity concentration layer in contact with $p^+$-type region 12, and $p^{--}$-type region 14b is formed around and in contact with $p^-$-type region 14a. The impurity concentration of $p^{--}$-type region 14b is set lower than that of $p^-$-type region 14a. In the same manner in the first embodiment, $p^-$-type region 14a is formed by implanting boron ion with the dose of $3 \times 10^{12}/cm^2$. Further, $p^{--}$-type region 14b is formed by implanting boron ion with the dose of $1.5 \times 10^{12}/cm^2$ into an area having the width of approx. 50 μm and surrounding $p^-$-type region 14a.

According to the embodiment, the concentration of electric field at corner portion 30 at the bottom of $p^+$-type region 12 can be more effectively prevented. That is, when a reverse bias voltage is applied to the device, a depletion layer extends in $n^-$-type layer 10, but the front edge of the depletion layer becomes smoother as it goes away from $p^+$-type layer 12. Therefore, the breakdown voltage can be made higher than that of the device in the first embodiment.

The above embodiments are related to a pn junction diode, but this invention can be applied to various type of planar devices such as MOSFET and thyristor having the same construction as the embodiments described above and having a high breakdown voltage. Next, an embodiment relating to a lateral MOSFET is explained.

Figure 5:
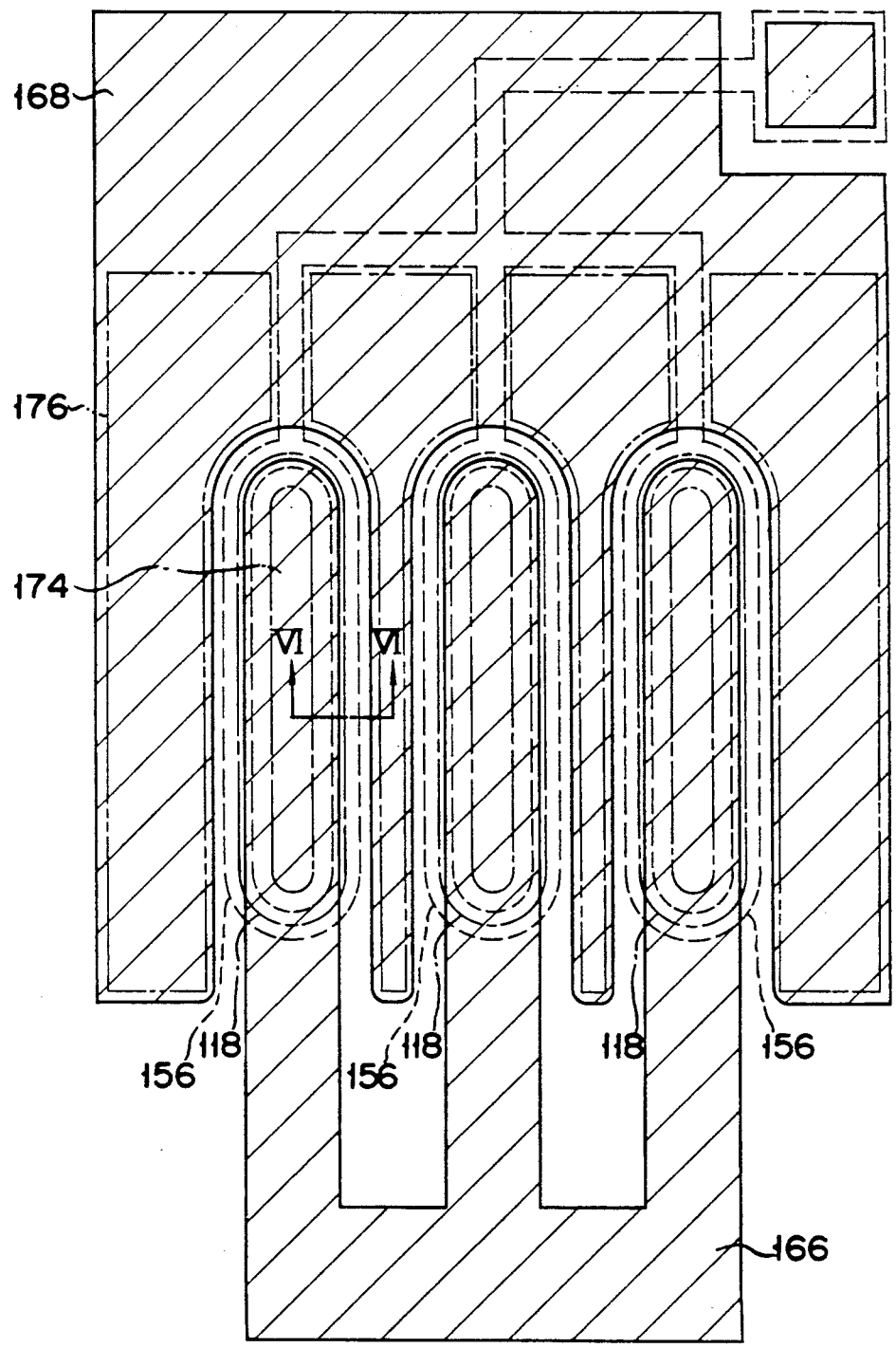
FIG. 5 is a plan view of a planar semiconductor device according to a third embodiment of this invention.
Figure 6:
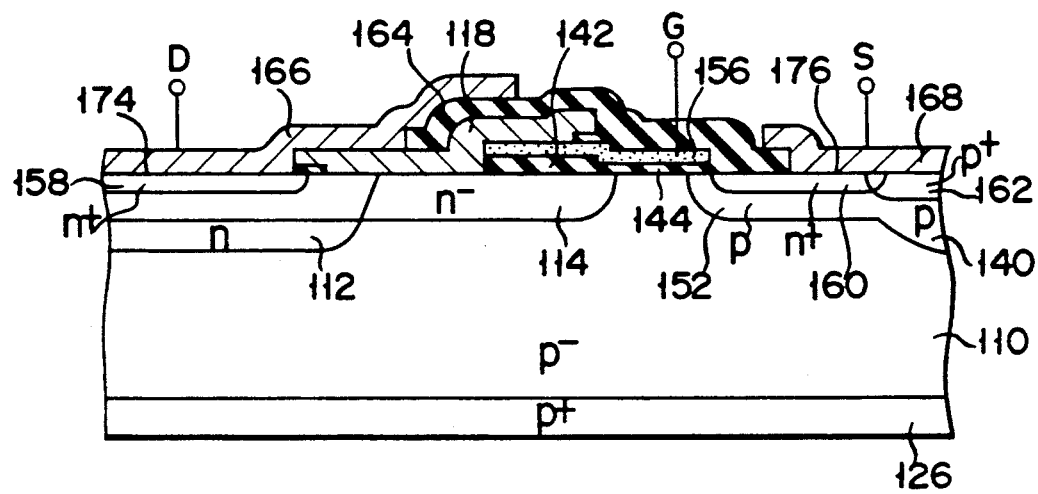
FIG. 6 is a cross-sectional view of FIG. 5 taken along line VI—VI.

A planar semiconductor device according to a third embodiment of this invention is explained with reference to FIGS. 5, 6 and 7A to 7G. The semiconductor device of the third embodiment is an n channel MOSFET. FIG. 5 is a plan view of the semiconductor device in which a drain region is divided into a plurality of portions to permit a large current operation. A plurality of gate electrodes 156 indicated by broken lines are each formed in a ring shape. A drain region is formed in each gate electrode 156 in FIG. 5. Drain electrode 166 and source electrode 168 are each formed in a comb shape and the teeth portions of drain electrode 166 and source electrode 168 are interposed with one another. Semi-insulating polycrystalline silicon films 118 indicated by one-dot-dash lines is formed in a ring shape to overlap with gate electrode 156 and drain electrode 166 in FIG. 5. Area 176 indicated by two-dot-dash lines is a contact area between source electrode 168 and the source region, and drain electrode 166 is formed in contact with the drain region in area 174. FIG. 6 is a cross-sectional view of FIG. 5 taken along line VI—VI. FIGS. 7A to 7G show the manufacturing process for the semiconductor device. With reference to FIGS. 7A to 7G, the construction of the semiconductor device is explained along with the manufacturing process.

Figure 7A:
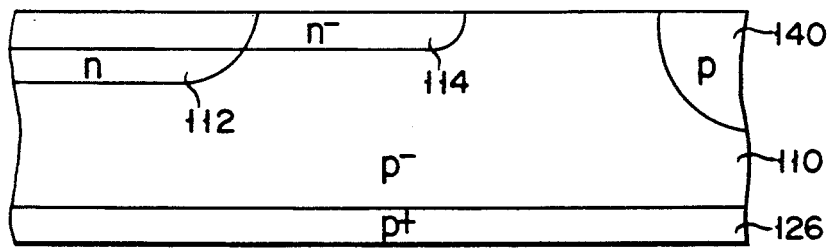
FIGS. 7A to 7G are diagrams showing a manufacturing process for the semiconductor device shown in FIG. 6.

As shown in FIG. 7A, in order to selectively form deep p-type region 140, a p-type impurity is diffused into the front surface area of $p^-$-type Si layer 110 which has $p^+$-type layer 126 formed in the rear surface area. Then, n-type layer 112 serving as a drain buffer region is formed in Si layer 110 apart from p-type region 140 at a predetermined distance, and $n^-$-type region 114 is formed around and in contact with n-type region 112 and is separated a predetermined distance from p-type region 140.

Figure 7B:
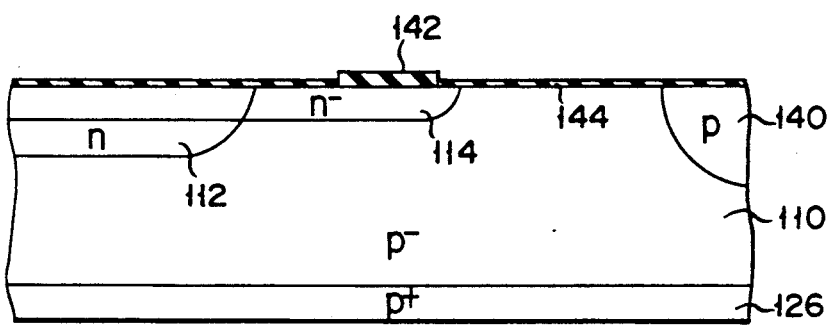

Next, as shown in FIG. 7B, a thick oxide film is formed on the entire surface of the structure and selectively etched to form field oxidation film 142 on $n^-$-type region 114. Thin oxide film 144 serving as a gate oxide film is formed on that surface of the semiconductor layer which is exposed by the etching process.

Figure 7C:
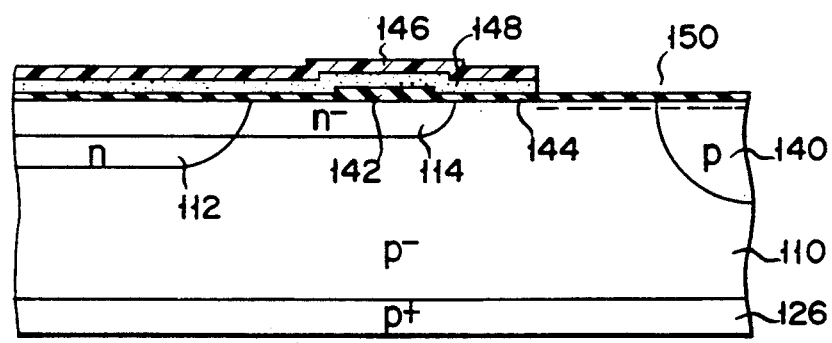

Then, as shown in FIG. 7C, a polycrystalline silicon film is deposited on the entire surface of the structure, and photoresist pattern 146 is formed on the polycrystalline silicon film. The polycrystalline silicon film is selectively etched out to form polycrystalline silicon pattern 148 with the photoresist pattern as a mask. Then, boron ion is implanted through opening 150 with photoresist pattern 146 and polycrystalline silicon pattern 148 as a mask.

Figure 7D:
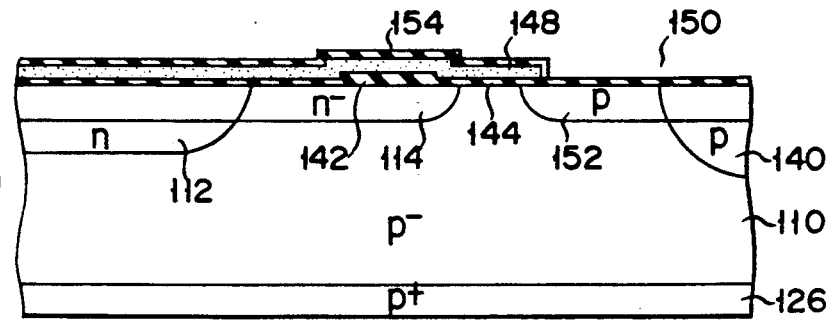

After photoresist pattern 146 is removed, the implanted boron ion is driven in to form p-type base region 152 and at the same time oxide film 154 is formed on the surface of the semiconductor device as shown in FIG. 7D.

Figure 7E:
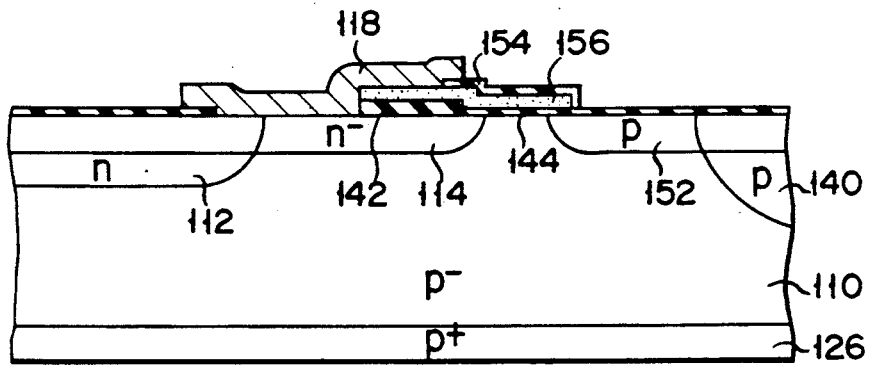

Next, as shown in FIG. 7E, polycrystalline silicon pattern 148 is selectively etched to form gate electrode 156. Then, portion of oxide film 144 which lies on n-type region 112 and $n^-$-type region 114 is removed and portion of oxide film 154 which lies on gate electrode 156 is removed. After this, semi-insulating polycrystal of n-type region 112 and $n^-$-type region 114 and gate electrode 156. Semi-insulating polycrystalline silicon film 118 is connected to n-type region 112, $n^-$-type region 114 and gate electrode 156.

Figure 7F:
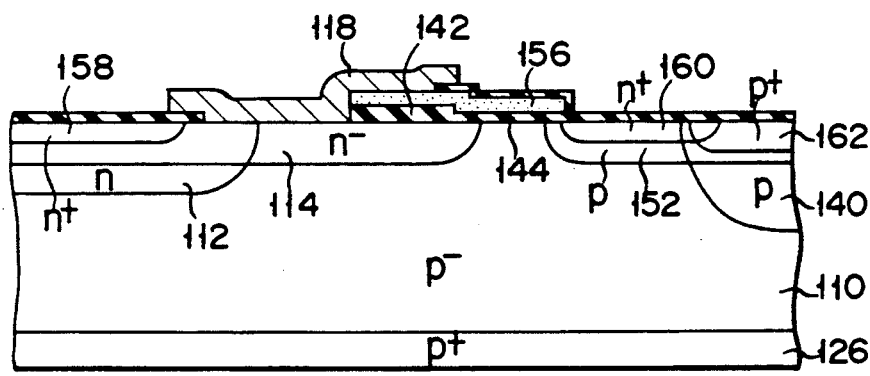

As shown in FIG. 7F, $n^+$-type region 158 serving as a drain region and $n^+$-type region 160 serving as a source region are formed with gate electrode 156 and semi-insulating polycrystalline silicon film 118 used as part of a mask. In order to lower the contact resistance of the contact portion between the source electrode and source layer 160, $p^+$-type region 162 is formed in contact with source region 160.

Figure 7G:
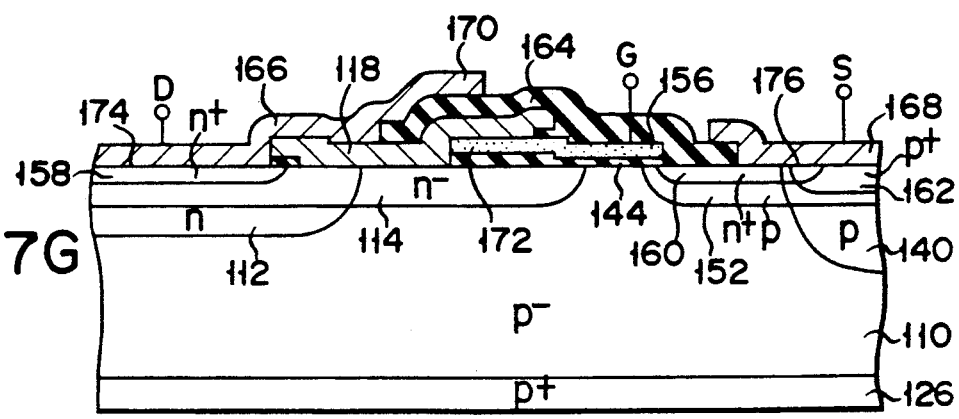

Next, as shown in FIG. 7G, insulation film 164 is formed on the entire surface of the structure, and insulation film 164 is selectively etched to expose part of semi-insulating polycrystalline silicon film 118, drain region 158, source region 160 and $p^+$-type region 162, thus forming a drain contact hole and a source contact hole. With the contact holes, drain electrode 166 and source electrode 168 are formed. Drain electrode 166 is formed in contact with $n^+$-type region 158 at drain contact 174 and in direct contact with semi-insulating polycrystalline silicon film 118. Further, one end portion 170 of drain electrode 166 is overlapping with one end portion 172 of gate electrode 156, and source electrode 168 is formed in contact with $n^+$-type region 160 and $p^+$-type region 162 at source contact 176.

With the lateral MOSFET as described above, a gate circuit of a low output impedance is connected between the gate and source, and a positive voltage is applied between the drain and source. Then, a small current flows through semi-insulating polycrystalline silicon film 118 having one end kept at the drain potential, and a uniform potential gradient in a lateral direction occurs in semi-insulating polycrystalline silicon film 118. This prevents the concentration of electric field in the device and particularly the local concentration of electric field at or near the drain junction. Since the electric field is forcedly create in semi-insulating polycrystalline silicon film 118 of high resistance, a depletion layer extends from the surface of n⁻-type region 114. Therefore, the depletion layer can be completely formed even if n⁻-type region 114 is formed to have an impurity concentration higher than in the conventional case, thus providing a sufficiently high breakdown voltage. Further, n⁻-type region 114 can be formed to have an impurity concentration higher than in the conventional case, attaining an ON-resistance lower than the conventional case. Further, in the device of this embodiment, since the potential between the drain and source is fixed by means of semi-insulating polycrystalline silicon film 118, the potential will not be affected by the electrode and wiring layers formed over insulation film 164. That is, semi-insulating polycrystalline silicon film 118 has a shield effect. For example, the breakdown voltage is not affected even if the drain electrode is formed wider.

Figure 8:
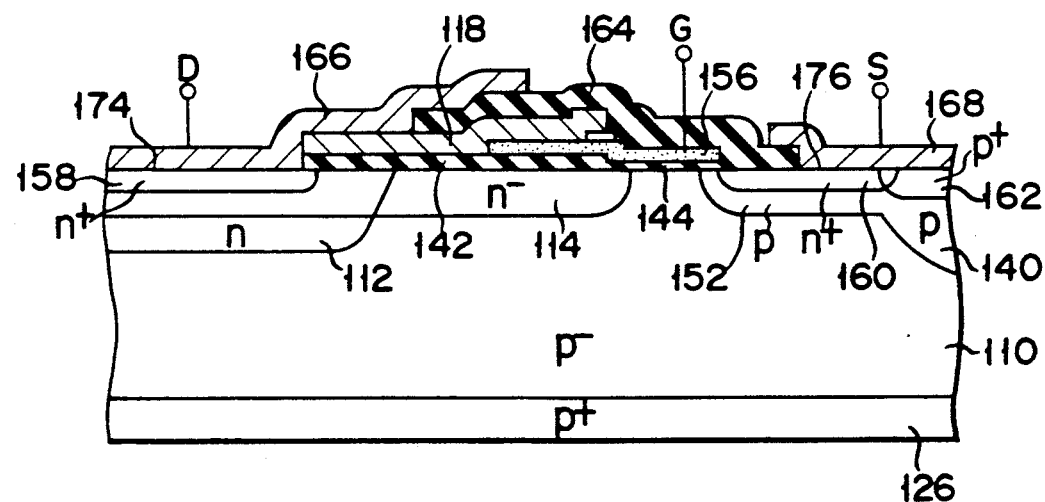
FIG. 8 is a cross-sectional view of a planar semiconductor device according to a fourth embodiment of this invention.

With reference to FIG. 8, a planar semiconductor device according to a fourth embodiment of this invention is explained. This embodiment is another lateral MOSFET. Portions of this embodiment corresponding to those in FIG. 6 are denoted by the same reference numerals and the explanation thereof is omitted. In this embodiment, semi-insulating polycrystalline silicon film 118 is not formed in direct contact with n-type region 112 and n⁻-type region 114. Semi-insulating polycrystalline silicon film 118 is formed on field insulation film 142 which is formed on n-type region 112 serving as a drain buffer region and n⁻-type region 114 surrounding n-type region 112. One end portion of semi-insulating polycrystalline silicon film 118 is connected to drain electrode 166 and the other end portion is connected to gate electrode 156. In this embodiment, the same effect as in the third embodiment of FIG. 6 can be obtained.

Figure 9:
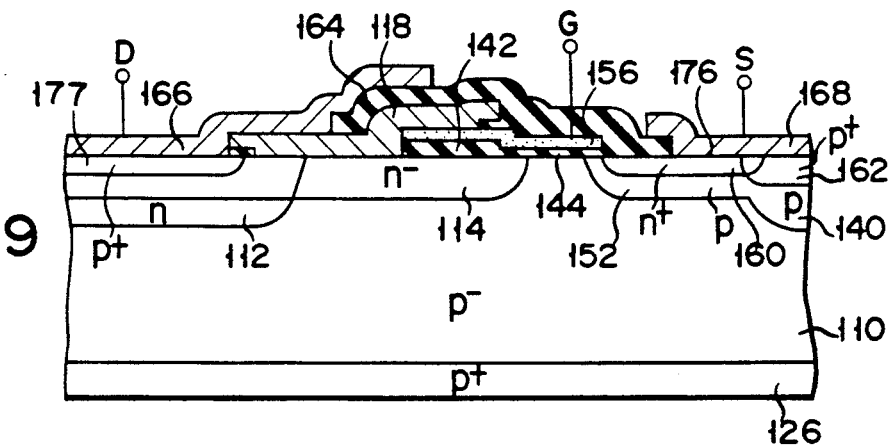
FIG. 9 is a cross-sectional view of a planar semiconductor device according to a fifth embodiment of this invention.

With reference to FIG. 9, a planar semiconductor device according to the fifth embodiment of this invention is explained. This embodiment is a conductivity modulated MOSFET in which n⁺-type region 158 in the FIG. 6 device is replaced by p⁺-type region 177. In other respects, this device is formed in the same manner as the embodiment of FIG. 6. Portions in this embodiment corresponding to those in FIG. 6 are denoted by the same reference numerals and the explanation thereof is omitted. In this embodiment, a low ON-resistance can be attained as an effect of the conductivity modulation, and the combined effect of semi-insulating polycrystalline silicon film 118 and n⁻-type region 114 can be obtained as in the former embodiment.

Figure 10:
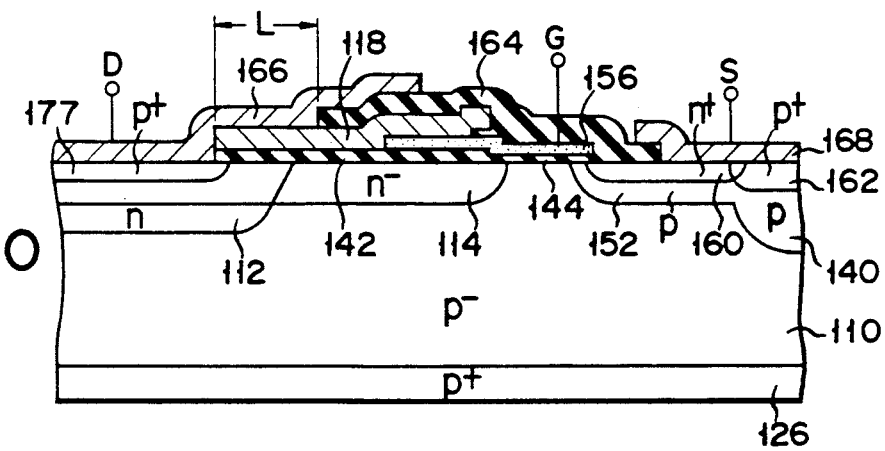
FIG. 10 is a cross-sectional view of a planar semiconductor device according to a sixth embodiment of this invention.

With reference to FIG. 10, a planar semiconductor device according to the sixth embodiment of this invention is explained. The device of this embodiment is also a conductivity modulated MOSFET which is different from the FIG. 9 device in that semi-insulating polycrystalline silicon film 118 is formed on field insulation film 142. In other respects, this device is formed in the same manner as the embodiment of FIG. 9. Portions in this embodiment corresponding to those in FIG. 9 are denoted by the same reference numerals and the detail explanation thereof is omitted. In this embodiment, the same effect as in the FIG. 9 device can be attained.

Figure 11:
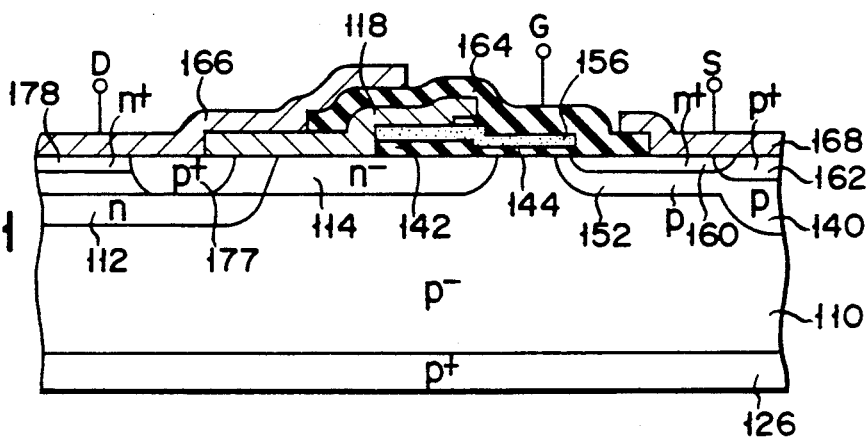
FIGS. 11 and 12 are cross-sectional views of a planar semiconductor device according to seventh embodiment of this invention.
Figure 12:
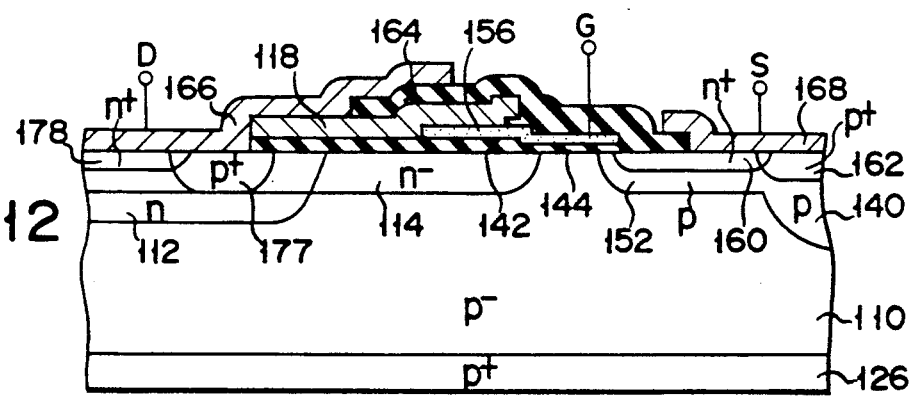

With reference to FIGS. 11 and 12, planar semiconductor devices according to the seventh embodiments of this invention are explained. FIG. 11 shows a device which has an anode shorted structure applied for the FIG. 9 semiconductor device, and FIG. 12 shows a device which has an anode shorted structure applied for the semiconductor device of FIG. 10 embodiment. In other respects, these devices are formed in the same manner as the embodiments of FIGS. 9 and 10. Portions in these embodiments corresponding to those in FIGS. 9 and 10 are denoted by the same reference numerals and the detail explanation thereof is omitted. In these embodiments, n⁺-type region 178 is formed in contact with p⁺-type drain region 177. Drain electrode 166 is formed in contact with p⁺-type drain region 177 and n⁺-type region 78. With the anode shorted structure, electrons accumulated in n⁻-type region 114 can be rapidly discharged at the turn-off period, enhancing the switching speed. In these embodiments, the same effects as in the former embodiments can be obtained due to the presence of semi-insulating polycrystalline silicon film 118 and n⁺-type region 114 of low impurity concentration.

Figure 13:
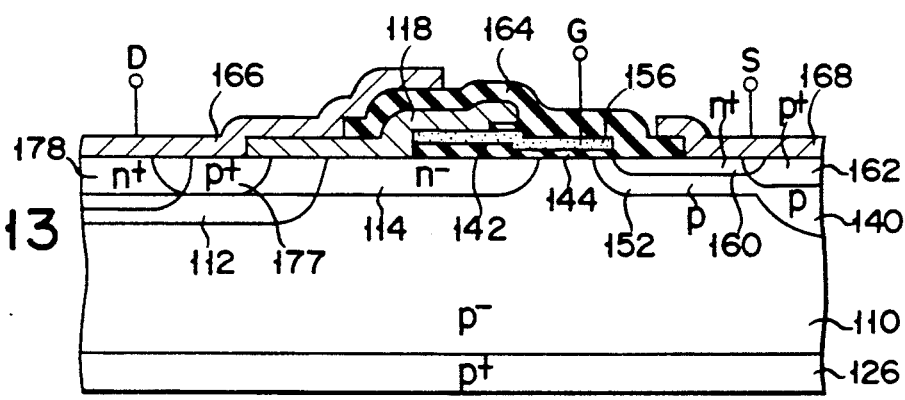
FIGS. 13 and 14 are cross-sectional views of a planar semiconductor device according to an eighth embodiment of this invention.
Figure 14:
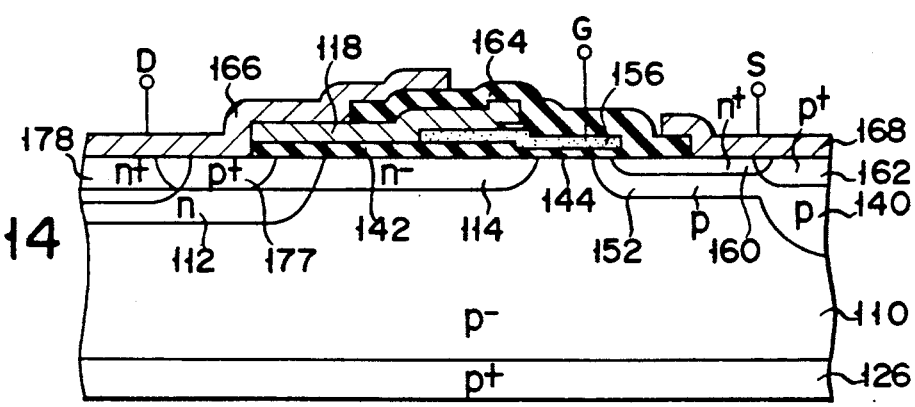

With reference to FIGS. 13 and 14, planar semiconductor devices according to the eighth embodiments of this invention are explained. In these embodiments, n⁺-type region 178 in the anode shorted portion is formed deep. That is, n⁺-type region 178 is formed deeper than p⁺-type drain region 177. In other respects, these devices are formed in the same manner as the embodiments of FIGS. 11 and 12. Portions in these embodiments corresponding to those in FIGS. 11 and 12 are denoted by the same reference numerals and the detail explanation thereof is omitted. In these embodiments, the switching speed can be made further higher than in the semiconductor device in FIGS. 11 and 12.

Figure 15:
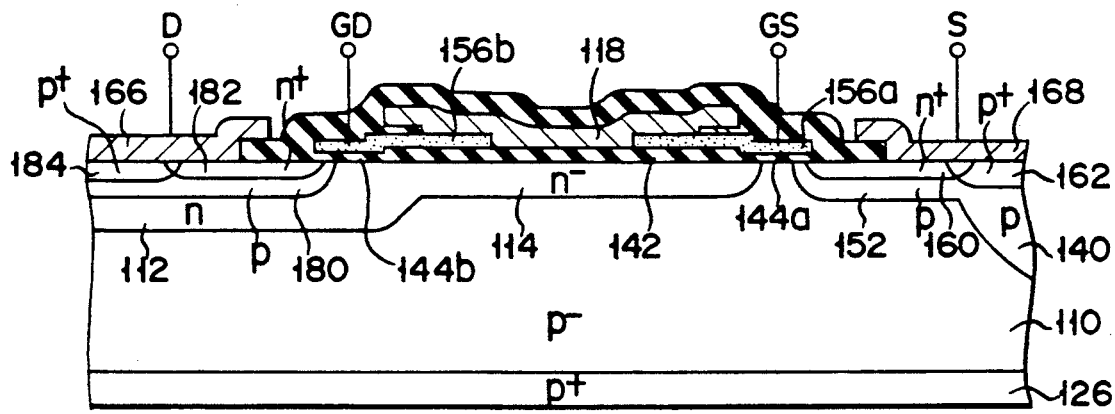
FIG. 15 is a cross-sectional view of a planar semiconductor device according to a ninth embodiment of this invention.

With reference to FIG. 15, a planar semiconductor device according to the ninth embodiment of this invention is explained. The semiconductor device of this embodiment is a MOSFET of double gate structure. In this embodiment, the same construction as in the source area is used in the drain area. In this case, p-type region 180 is formed in the surface of n-type region 112, and n⁺-type region 182 and p⁺-type region 184 are formed in contact with each other in the surface of p-type region 180. In the source area, first gate electrode 156a is formed on first gate oxide film 144a, and in the drain area, second gate electrode 156b is formed on second gate oxide film 144b. Further, semi-insulating polycrystalline silicon film 118 is formed in electrode 156b. Semi-insulating polycrystalline silicon film 118 is also formed on field oxide film 142 which is formed on n⁻-type region 114. In other respects, this device is formed in the same manner as the embodiment of FIG. 6. Portions in this embodiment corresponding to those in FIG. 6 are denoted by the same reference numerals and the explanation thereof is omitted. In this embodiment, the same effect as that of the former embodiment can be attained due to the combined effect of semi-insulating polycrystalline silicon film 118 and n⁻-type region 114.

Figure 16:
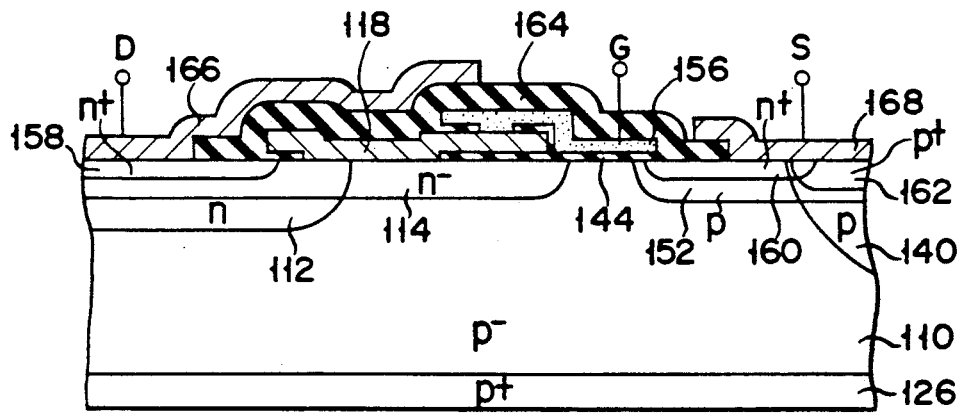
FIG. 16 is a cross-sectional view of a planar semiconductor device according to a tenth embodiment of this invention.
Figure 17A:
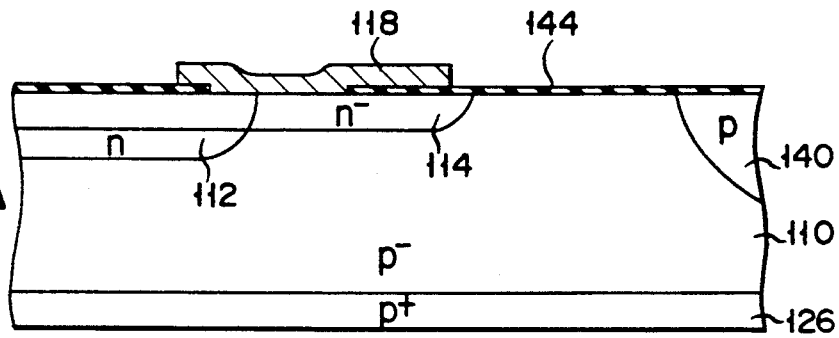
FIGS. 17A to 17C are diagrams showing a manufacturing process for the semiconductor device shown in FIG. 16.
Figure 17B:
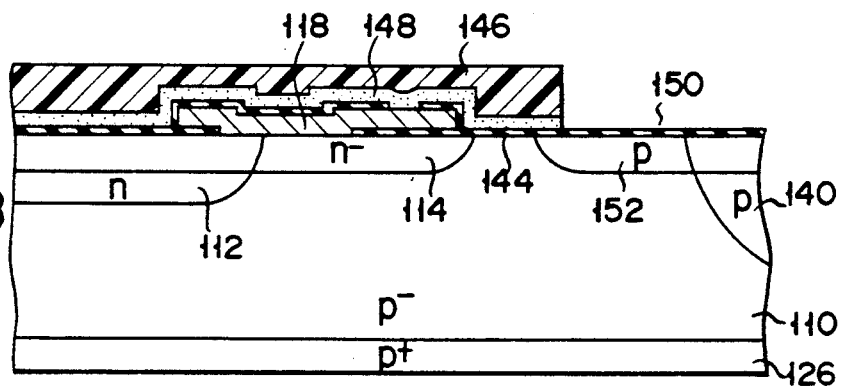
Figure 17C:
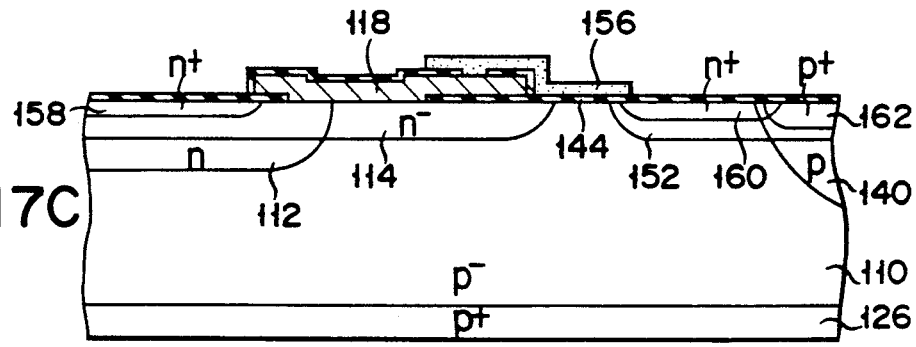

With reference to FIG. 16, a planar semiconductor device according to the tenth embodiment of this invention is explained. In the semiconductor device of this embodiment, gate electrode 156 and semi-insulating polycrystalline silicon film 118 of the semiconductor device in FIG. 6 change places with each other. That is, in the semiconductor device of FIG. 6, gate electrode 156 is disposed under semi-insulating polycrystalline silicon film 118 and formed in contact with the under surface of semi-insulating polycrystalline silicon film 118. However, in the semiconductor device of FIG. 16, gate electrode 156 is formed in contact with the upper surface of semi-insulating polycrystalline silicon film 118. FIGS. 17A to 17C show the manufacturing process for the MOSFET in FIG. 16.

As shown in FIG. 17A, p-type region 140, n-type region 112 and n⁻-type region 114 are formed in the front surface area of p⁻-type silicon layer 110 which has p⁺-type layer 126 formed on the rear surface. Thin oxide film 144 serving as a gate oxide film is formed on the entire front surface of the structure and then selectively etched out to expose portions of n-type region 112 and n⁻-type region 114. Semi-insulating polycrystalline silicon film 118 is formed in contact with the exposed portions of n-type region 112 and n⁻-type region 114.

Next, as shown in FIG. 17B, the surface of semi-insulating polycrystalline silicon film 118 is oxidized to form an oxide film. The oxide film is selectively etched to form an opening. Then, polycrystalline silicon film is deposited on the entire surface of the structure and photoresist pattern 146 is formed on the polycrystalline silicon film. That portion of the polycrystalline silicon film which lies in the source area is selectively etched with the photoresist film as a mask, thus forming opening 150 and polycrystalline silicon pattern 148. Then, p-type impurity is diffused into p⁻-type layer 110 through opening 150 to form p-type region 152 with photoresist pattern 146 and polycrystalline silicon pattern 148 as mask.

Next, photoresist pattern 146 is removed and polycrystalline silicon pattern 148 is selectively etched to form gate electrode 156 as shown in FIG. 17C. Then, n⁺-type region 158 is formed in the surface area of n-type region 112, and n⁺-type region 160 and p⁺-type region 162 are formed in the surface area of p-type region 152 using predetermined masks. The succeeding steps are not explained here but can be effected in the same manner as described with reference to FIG. 7G to form necessary insulation films and electrodes, thus obtaining the MOSFET as shown in FIG. 16.

In this reference, the same effect as that obtained in the former embodiments can be attained. Further, the construction of FIG. 16 can be applied to the embodiments shown in FIGS. 8 to 15.

With reference to FIG. 18, a planar semiconductor device according to the eleventh embodiment of this invention is explained. In a conductivity modulated MOSFET of this embodiment, one end of semi-insulating polycrystalline silicon film 118 is connected to drain electrode 166 and the other end thereof is connected to source electrode 168. Semi-insulating polycrystalline silicon film 118 is electrically isolated from gate electrode 156 via oxide film 186. In other respects, this device is formed in the same manner as the embodiment of FIG. 10, and portions in this embodiment corresponding to those in FIG. 10 are denoted by the same reference numerals and the detail explanation thereof is omitted. In this embodiment, the same effect as in the former embodiment can be attained.

Figure 20:
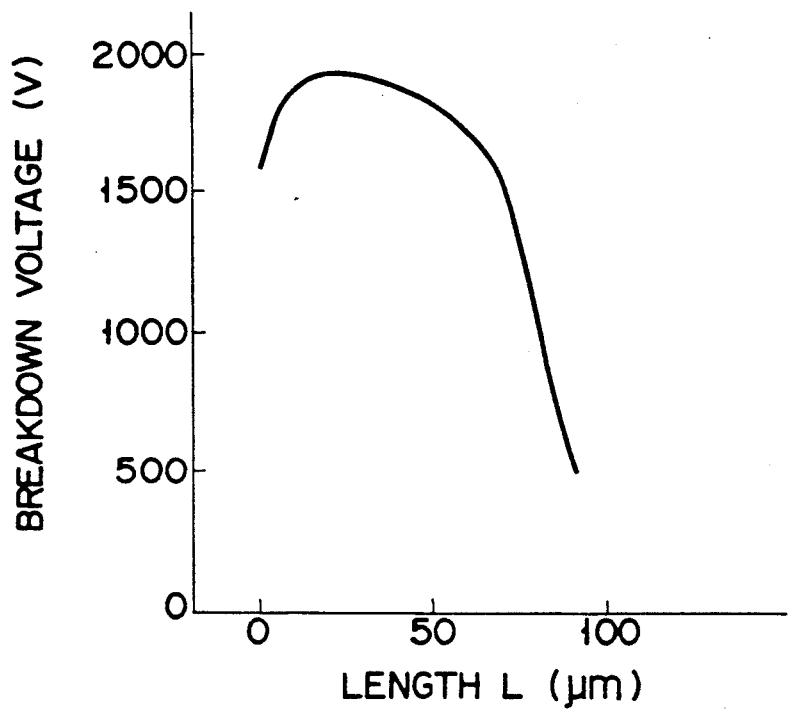
FIG. 20 is a diagram showing the relation between a length L of an anode electrode and a breakdown voltage.
Figure 21:
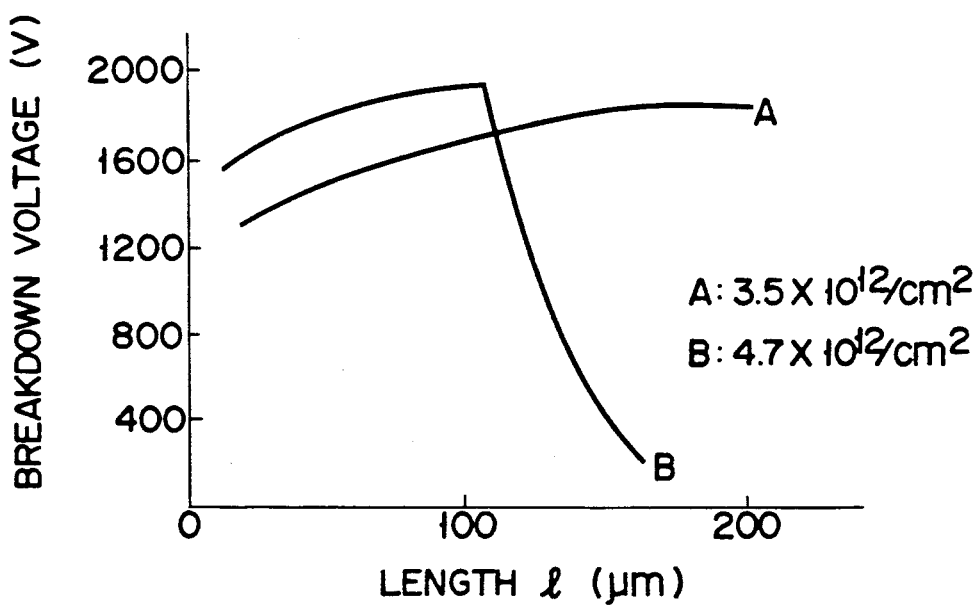
FIG. 21 is a diagram showing the relation between a length l of the $p^{---}$-type layer and a breakdown voltage.

With reference to FIGS. 19 to 21, a planar semiconductor device according to the twelfth embodiment of this invention is explained. The semiconductor device of this embodiment is a p⁺n-junction diode similar to that shown in FIG. 2. In the semiconductor device of this embodiment, insulation film 40 of, for example, $SiO_2$ with a thickness of 1 $\mu$m is formed on the surface portion of the semiconductor layer which lies between p⁺-type region 12 and n⁺-type region 16. Anode electrode 24 of low resistance conductive material such as Al is formed in contact with p⁺-type region 12 and on insulation film 40. Anode electrode 24 extends from the boundary of p⁺-type region 12 and p⁻-type region 14 towards n⁺-type region 16 by distance L, for example, 20 $\mu$m. Al electrode 42 which serves to derive the potential of n⁻-type Si layer 10 is formed in contact with n⁺-type region 16. High resistance film 18 which is connected at one end to anode electrode 24 and at the other end to Al electrode 42 is formed on insulation film 40. High resistance film 18 may be formed of amorphous silicon. Further, p⁻-type region 14 extends from the contact portion with p⁺-type region 12 towards n⁺-type region 16 by distance l. In other respects, this device is formed in the same manner as the embodiment of FIG. 2, and portions in this embodiment corresponding to those in FIG. 2 are denoted by the same reference numerals and the detail explanation thereof is omitted.

FIG. 20 shows the relation between length L of the anode electrode and the breakdown voltage of a junction between p⁺-type region 12 and n⁻-type region 10. As is clearly seen from FIG. 20, a maximum breakdown voltage can be obtained when length L of the electrode is 25 $\mu$m. That is, 90% of the theoretical breakdown voltage or the breakdown voltage of the ideal plane junction is attained. In the case where a breakdown voltage higher than 80% of the breakdown voltage of the ideal plane junction is accepted as a sufficiently high breakdown voltage, the length L of the electrode may be set 5 to 60 $\mu$m.

FIG. 21 shows the relation between length of p⁻-type region 14 and the breakdown voltage, when length L of the electrode of the semiconductor device is set to 20 $\mu$m. Curve A indicates data taken when the impurity amount of p⁻-type region 14 is $3.5 \times 10^{12}/cm^2$, and curve B indicates data taken when the impurity amount of p⁻-type region 14 is $4.7 \times 10^{12}/cm^2$. When the impurity amount of p⁻-type region 14 is $4.7 \times 10^{12}/cm^2$, the maximum value is obtained when length l of p⁻-type region 14 is 110 $\mu$m. If 70% or more of the breakdown voltage of the ideal planar junction can be accepted, length l of p⁻-type region 14 may be set less than 120 $\mu$m when the impurity amount of p⁻-type region 14 is set more than $4 \times 10^{12}/cm^2$.

Further, according to this embodiment, since a uniform electric field is created in high resistance film 18, an electric field will not be locally concentrated in $SiO_2$ film 40. Therefore, in the semiconductor device of this embodiment, a leak current will not increase at a high temperature.

Figure 22:
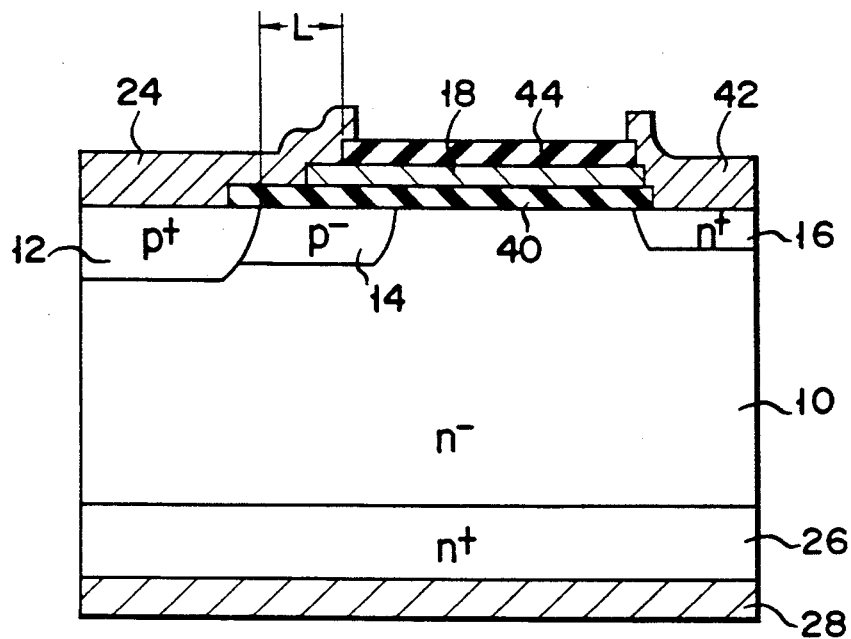
FIG. 22 is a cross-sectional view of a planar semiconductor device according to a thirteenth embodiment of this invention.

With reference to FIG. 22, a planar semiconductor device according to the thirteenth embodiment of this invention is explained. The device of this embodiment is p⁺n-junction diode. Portions corresponding to those in FIG. 19 are denoted by the same reference numerals and the explanation thereof is omitted. In the device of this embodiment, semi-insulating polycrystalline silicon film (SIPOS) 18 is used as a high resistance film. Semi-insulating polycrystalline silicon film 18 is formed before metal electrodes 24 and 42 are formed. The manufacturing process is as follows.

First, semi-insulating polycrystalline silicon film 18 is formed on insulation film 40 and insulation film 44 of, for example, a CVD oxide film is formed on semi insulating polycrystalline silicon film 18. Then, end portions of semi-insulating polycrystalline silicon film 18 are exposed, and electrodes 24 and 42 of Al are formed in contact with the exposed end portions of semi-insulating polycrystalline silicon film 18, respectively.

In the device of this embodiment, that part of anode electrode 24 which lies on the field area, that is, which corresponds to length L of 5 to 60 μm cooperates with semi-insulating polycrystalline silicon film 18 to form a field plate. Thus, the field plate is formed with a low resistance, and therefore the breakdown voltage can be enhanced as in the former embodiments.

Figure 23:
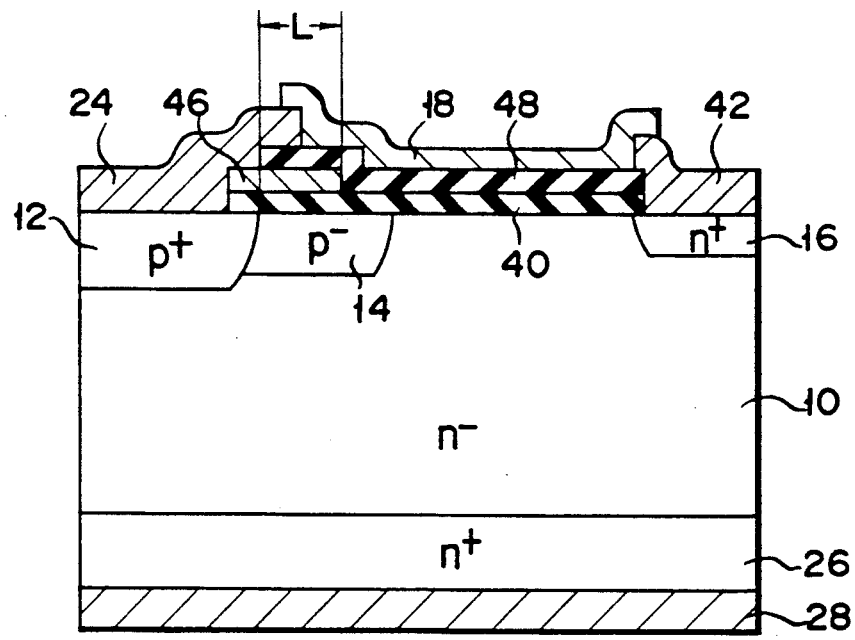
FIG. 23 is a cross-sectional view of a planar semiconductor device according to a fourteenth embodiment of this invention.

With reference to FIG. 23, a planar semiconductor device according to the fourteenth embodiment of this invention is explained. The device of this embodiment is a $p^+n^-$junction diode. In the device of this embodiment, after insulation film 40 is formed, low resistance conductive film 46 formed of a polycrystalline silicon film having an impurity doped therein is formed on insulation film 40. Low resistance conductive film 46 is formed to cover $p^+$-type region 12 and $p^-$-type region 14. Insulation film 48 is formed on low resistance conductive film 46 and insulation film 40 with portion of low resistance conductive film 4 kept exposed. Then, anode electrode 24 of Al is formed in contact with low resistance conductive film 46, and electrode 42 of Al is formed in contact with $n^+$-type region 16. After this, high resistance film 18 of amorphous silicon is formed on insulation film 48. One end of high resistance film 18 is connected to anode electrode 24 and the other end is connected to A electrode 42. In other respects, this device is formed in the same manner as the embodiment of FIG. 19, and portions in this embodiment corresponding to those in FIG. 19 are denoted by the same reference numerals and the detail explanation thereof is omitted.

In this embodiment, the resistance of the field plate existing near the junction between $p^+$-type region 12 and $p^-$-type region 14 can also be reduced by setting distance L to 5 to 60 μm in FIG. 23, thus enhancing the breakdown voltage as in the semiconductor device of FIG. 19. In particular, since low resistance conductive film 46 is formed, the distribution of electric field in the substrate near the junction, that is, the configuration of the depletion layer can be appropriately designed.

With reference to FIG. 24, a planar semiconductor device according to the fifteenth embodiment of this invention is explained. The device of this embodiment is a $p^+n^-$junction diode. In the device of this embodiment, insulation film 40 is formed to cover that portion of $p^-$-type region 14 which forms the junction with $n^-$-type region 10. High resistance film 18 is formed in contact with $p^+$-type region 12 and $p^-$-type region 14, it is connected at one end to anode electrode 24 and at the other end to A electrode 42. In other respects, this device is formed in the same manner as the embodiment of FIG. 22, and portions in this embodiment corresponding to those in FIG. 22 are denoted by the same reference numerals and the detail explanation thereof is omitted.

In this embodiment, the resistance of part of high resistance film 18 can also be reduced by setting distance L at 5 to 60 μm in FIG. 24, thus enhancing the breakdown voltage as in the semiconductor device of FIG. 22. In particular, since insulation film 40 is formed to extend from the junction end of $p^-$-type region 14 towards $n^+$-type region 16, the difference in level of anode electrode 24 can be made small and the step coverage of anode electrode 24 can be improved, thus enhancing the reliability of this device.

With reference to FIG. 25, a planar semiconductor device according to the sixteenth embodiment of this invention is explained. The device of this embodiment is a $p^+n^-$ junction diode. The device is different from that of FIG. 19 in that $p^-$-type region 14a of low impurity concentration is formed in contact with $p^+$-type region 12 and $p^{--}$-type region 14b of impurity concentration lower than that of $p^-$-type region 14a is formed in contact with $p^-$-type region 14a. The same manufacturing method as is used for the device shown in FIG. 4 can be used to form $p^{--}$-type region 14b. In this embodiment, the breakdown voltage can be enhanced as in the former embodiments by setting distance L at 5 to 60 μm. Further, in the case where the low impurity concentration regions are formed in the two-step form as in this embodiment, the breakdown voltage as explained with reference to FIG. 21 can be kept high by setting to less than 120μ length of the low impurity concentration region with an impurity concentration of $4 \times 10^{12}/cm^2$ or more. Further, as in the embodiment shown in FIG. 4, the concentration of electric field at the curved portion on the bottom of $p^+$-type region 12 can be prevented to a greater extent, and the geometric configuration of the depletion layer can be made smooth.

In the embodiments of FIGS. 19 to 25, the method of forming the field plate of low resistance at or near the boundary between $p^+$-type region 12 and $p^-$-type region 14 is not limited to that described above. The field plate of low resistance can be formed by doping an impurity into a part of the amorphous or semi-insulating polycrystalline silicon film.

Figure 26:
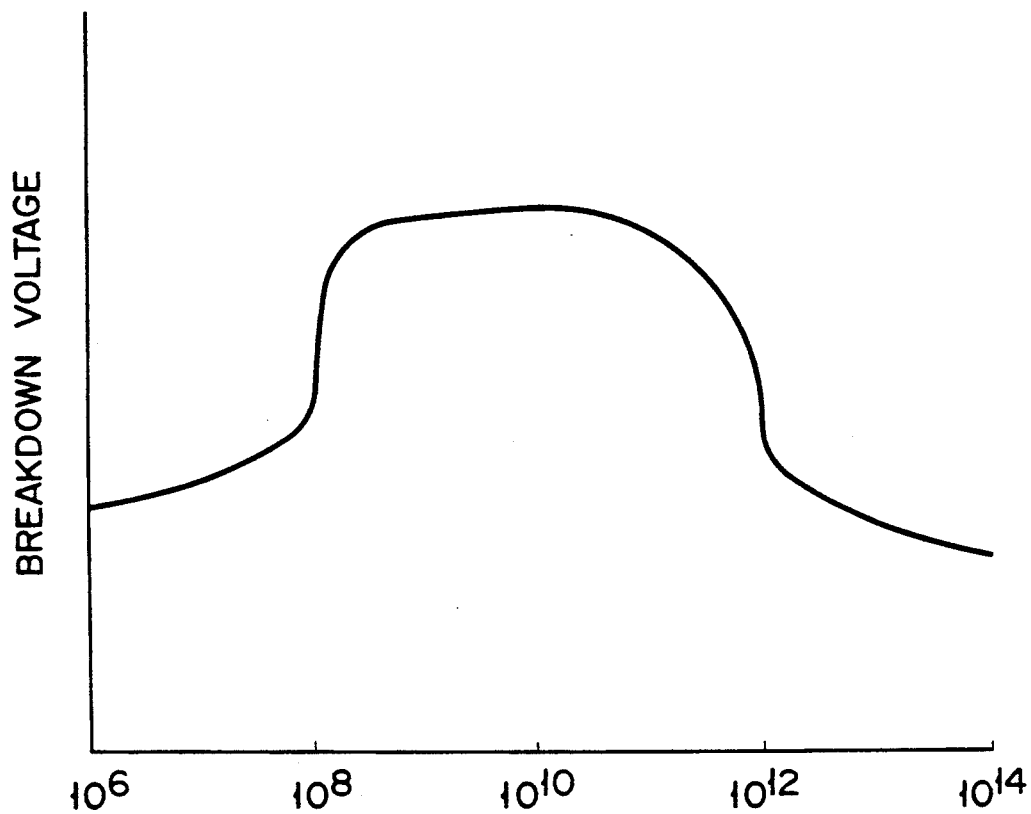
FIG. 26 is a diagram showing the relation between a resistivity of an undoped semi-insulating polycrystalline silicon and a breakdown voltage.

In the case where the metal electrode is under the high resistance film as shown in FIG. 19, it is sufficient to set the resistivity of the high resistance film at more than $10^7$ Ω.cm so as to use the contact portion between the metal electrode and the high resistance film as a field plate. In the case where the metal electrode is over the high resistance film as shown in FIGS. 10 and 22, it is necessary to set the resistivity of the high resistance film, for example SIPOS, within the range of $10^8$ to $10^{12}$ Ω.cm as shown in FIG. 26. If the resistivity is lower than $10^8$ Ω.cm, it is recognized by the experiments that the potential of the metal electrode formed on the SIPOS can not sufficiently reach to the oxide film under the SIPOS.

The technology used in the device of the embodiments of FIGS. 19 to 25 can be applied to the semiconductor device of the first to eleventh embodiments. That is, in order to use the contact portion between the low resistance film (for example, drain electrode) and the high resistance film as a field plate, distance L of the low resistance film measured from the boundary between the high and low impurity concentration regions of the same conductivity type may be set at 5 to 60 μm. Further, if the contact portion between the low and high resistance films is formed at least over the boundary, the contact portion can effectively function as a field plate, thus preventing the concentration of electric field in the semiconductor device.

In the embodiments described above, the conductivity type of each semiconductor region can be changed. Further, this invention can be variously modified without departing from the scope of this invention.

Figure 27:
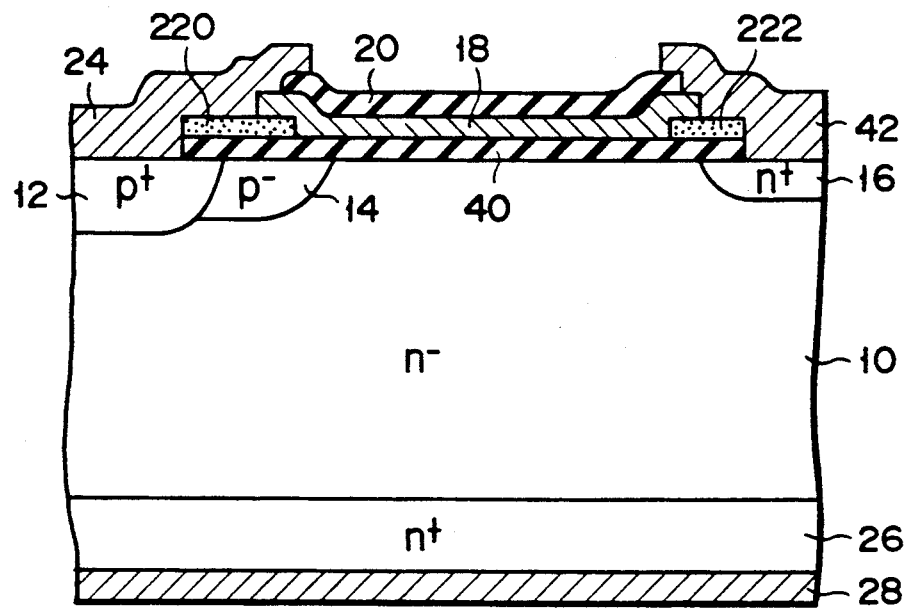
FIG. 27 is a sectional view of a planar semiconductor device according to the seventeenth embodiment of the present invention.

A planar semiconductor device of the seventeenth embodiment of the present invention will be described, with reference to FIG. 27. This embodiment provides a pn junction diode. High-impurity concentration $p^+$-type region 12 (which functions as an anode) is formed in the surface region of high-resistance $n^-$-type Si layer 10 (which functions as a substrate). Low-impurity concentration $p^-$-type region 14 is formed around $p^+$-type region 12. The total impurity amount in p⁻-type region 14 is within the range of $1.5 \times 10^{12}/cm^2$ to $4.5 \times 10^{12}/cm^2$, if viewed from the surface. At a location which is away from p⁻-type region 14 by a predetermined distance and which is in the periphery of the element, n⁺-region 16 is formed. This n⁺-type region serves as a stopper for stopping the expansion of a depletion layer. Insulation film 40 is formed on the surfaces of p⁺-type region 12, p⁻-type region 14, high-resistance n⁻-type Si layer 10 and n⁺-type region 16. On this insulating film 40, semi-insulating polycrystalline silicon (SIPOS) film 18 is formed. One end of this semi-insulating polycrystalline silicon film 18 is in contact with polysilicon 220 which is located on insulation film 40 and which is connected to anode electrode 24. The other end of semi-insulating polycrystalline silicon film 18 is in contact with polysilicon 222 which is located on insulation film 40 and which is connected to electrode 42.

Polycrystalline silicon film 18 is a high-resistance film whose resistivity is more than $10^7$ Ωcm, preferably within the range of $10^7$ to $10^{12}$ Ωcm. The surface of the element is covered with SiO₂ film 20. Anode electrode 24 is located within contact hole 22 formed in SiO₂ film 20. Low-resistance n⁺-type layer 26 is formed on the reverse side of n⁻ layer 10, and cathode electrode 28 is formed on n⁺-type layer 26.

To increase the breakdown voltage of the element, a uniform electric field must be generated in SIPOS 18. However, such an electric field cannot be generated if the contact resistance of SIPOS 18 is high. If polysilicon 220 and polysilicon 222 are in contact with SIPOS 18, as in the seventeenth embodiment, the contact resistance of SIPOS 18 is prevented from becoming high. Further, if electrodes 24 and 42, formed of e.g. aluminum, are in contact with polysilicon 220 and polysilicon 222, respectively, it is possible to obtained desirable electrodes without adversely affecting SIPOS 18.

Figure 28:
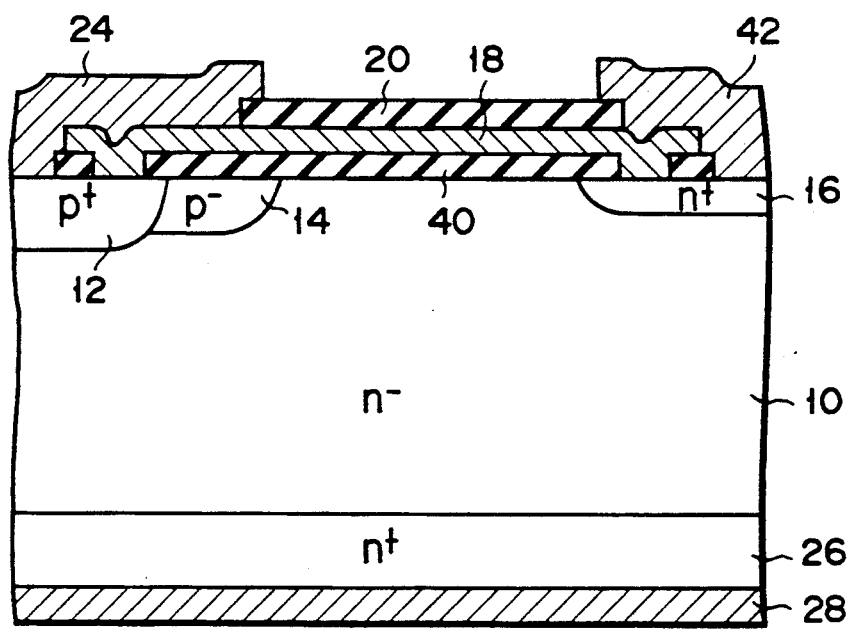
FIG. 28 is a sectional view of a planar semiconductor device according to the eighteenth embodiment of the present invention.

A planar semiconductor device of the eighteenth embodiment of the present invention will be described, with reference to FIG. 28. In this embodiment, one end of SIPOS 18 is in direction contact with p⁺-type region 12, while the other end thereof is in direct contact with n⁺-type region 16. Since the other structure of the eighteenth embodiment are similar to the corresponding structures of the seventeenth embodiment, they are denoted by the same reference numerals and explanation of them will be omitted.

In the eighteenth embodiment, the ends of SIPOS 18 are in contact with silicon layers, so that the contact resistance of SIPOS 18 is prevented from becoming high. Since, therefore, a uniform electric field is generated in SIPOS 18, the breakdown voltage of the element can be improved.

Figure 29:
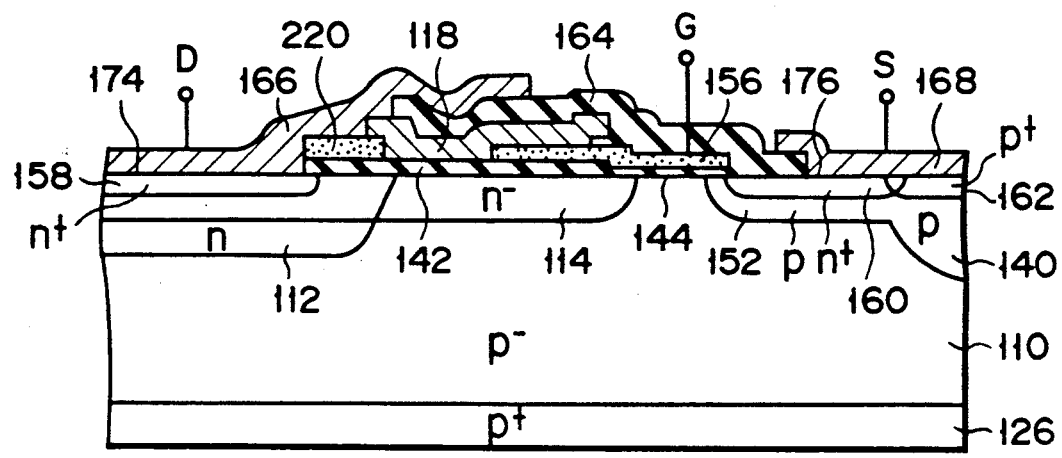
FIG. 29 is a sectional view of a planar semiconductor device according to the nineteenth embodiment of the present invention.

FIG. 29 shows a planar semiconductor device according to the nineteenth embodiment of the present invention. This embodiment is an improvement of the planar semiconductor device shown in FIG. 8. In the embodiment shown in FIG. 8, SIPOS 118 is in direct contact with drain electrode 166, which is formed of aluminum, for example. In the nineteenth embodiment, in contrast, polysilicon layer 220 is arranged between SIPOS 118 and drain electrode 166, and both SIPOS 118 and drain electrode 166 are in contact with polysilicon layer 220. In the nineteenth embodiment as well, a uniform electric field can be generated in SIPOS 118, so that it is possible to improve the breakdown voltage of the element.

Figure 30:
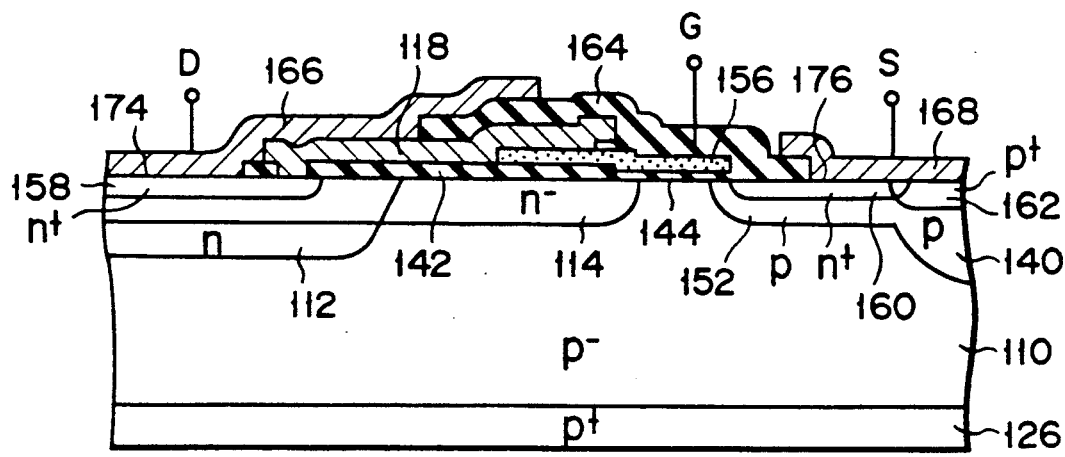
FIG. 30 is a sectional view of a planar semiconductor device according to the twentieth embodiment of the present invention.

FIG. 30 shows a planar semiconductor device according to the twentieth embodiment of the present invention. This embodiment is also an improvement of the planar semiconductor device shown in FIG. 8. In the embodiment shown in FIG. 8, SIPOS 118 is in direct contact with drain electrode 166, which is formed of e.g., aluminum. In the twentieth embodiment, in contract, SIPOS 118 is in contact with not only drain electrode 166 but also n⁺-type region 158. In the twentieth embodiment, SIPOS 118 is in contact with silicon layers, so that its contact resistance is not high. Since, therefore, a uniform electric field can be generated in SIPOS 118, it is possible to improve the breakdown voltage of the element.

FIG. 31 shows a planar semiconductor device according to the twenty-first embodiment of the present invention. This embodiment is an improvement of the planar semiconductor device shown in FIG. 10. In the embodiment shown in FIG. 10, SIPOS 118 is in direct contact with drain electrode 166, which is formed of aluminum, for example. In the twenty-first embodiment, in contrast, polysilicon layer 220 is arranged between SIPOS 118 and drain electrode 166, and both SIPOS 118 and drain electrode 166 are in contact with polysilicon layer 220. In the twenty-first embodiment as well, a uniform electric field can be generated in SIPOS 118, so that it is possible to improve the breakdown voltage of the element.

FIG. 32 shows a planar semiconductor device according to the twenty-second embodiment of the present invention. This embodiment is also an improvement of the planar semiconductor device shown in FIG. 10. In the embodiment shown in FIG. 10, SIPOS 118 is in direct contact with drain electrode 166, which is formed of e.g., aluminum. In the twenty-second embodiment, in contrast, SIPOS 118 is in contact with not only drain electrode 166 but also p⁺-type region 177. In the twentieth embodiment, SIPOS 118 is in contact with silicon layers, so that its contact resistance is not high. Since, therefore, a uniform electric field can be generated in SIPOS 118, it is possible to improve the breakdown voltage of the element.

Figure 33:
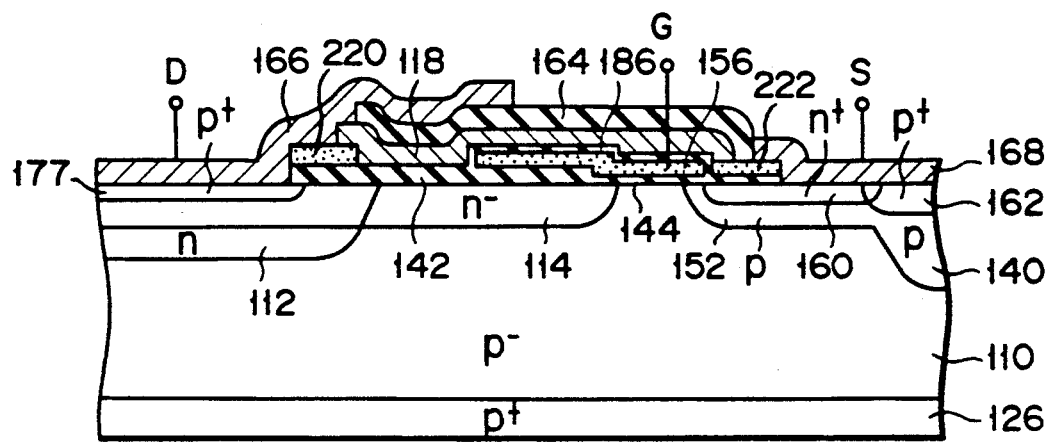
FIG. 33 is a sectional view of a planar semiconductor device according to the twenty-third embodiment of the present invention.

FIG. 33 shows a planar semiconductor device according to the twenty-third embodiment of the present invention. This embodiment is an improvement of the planar semiconductor device shown in FIG. 18. In the embodiment shown in FIG. 18, one end of SIPOS 118 is in contact with drain electrode 166 (which is formed of e.g., aluminum), while the other end thereof is in contact with source electrode 168 (which is formed of e.g., aluminum). In the twenty-third embodiment, in contrast, polysilicon layer 220 is arranged between SIPOS 118 and drain electrode 166, and polysilicon layer 222 is arranged between SIPOS 118 and source electrode 168. In other words, polysilicon layer 220 is in contact with both SIPOS 118 and drain electrode 166, and polysilicon layer 222 is in contact with both SIPOS 118 and source electrode 168. In the twenty-third embodiment as well, a uniform electric field can be generated in SIPOS 118, so that it possible to improved the breakdown voltage of the element.

Figure 34:
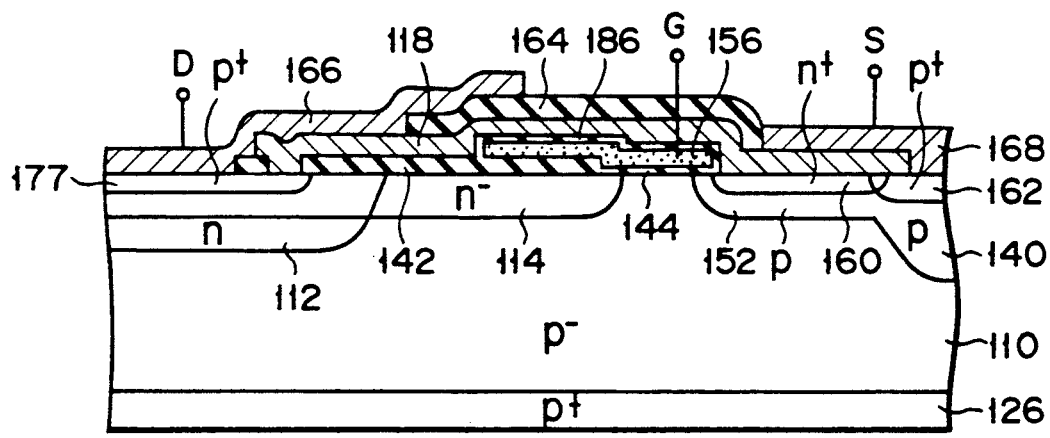
FIG. 34 is a sectional view of a planar semiconductor device according to the twenty-fourth embodiment of the present invention.

FIG. 34 shows a planar semiconductor device according to the twenty-four embodiment of the present invention. This embodiment is also an improvement of the planar semiconductor device shown in FIG. 18. In the embodiment shown in FIG. 18, one end of SIPOS 118 is in contact with drain electrode 166 (which is formed of e.g., aluminum), while the other end thereof is in contact with source electrode 168 (which is formed of e.g., aluminum). In the twenty-fourth embodiment, in contrast, one end of SIPOS 118 is in contact with not only drain electrode 166 but also p+-type region 177, while the other end thereof is in contact with not only source electrode 168 but also n+-type region 160. In the twenty-fourth embodiment, SIPOS 118 is in contact with silicon layers, so that its contact resistance is not high. Since, therefore, a uniform electric field can be generated in SIPOS 118, it is possible to improve the breakdown voltage of the element.

What is claimed is:

1. A planar semiconductor device having a breakdown voltage, comprising:
    a semiconductor layer of a first conductivity type;
    a first semiconductor region of a second conductivity type selectively formed in the surface of said semiconductor layer to form a pn junction together with said semiconductor layer, said first semiconductor region having an impurity concentration higher than that of said semiconductor layer and therefore a resistivity lower than that of said semiconductor layer;
    a second semiconductor region of the second conductivity type formed surrounding said first semiconductor region, said second semiconductor region forming a pn junction together with said semiconductor layer and having an impurity concentration lower than that of said first semiconductor region;
    a high resistance film having a resistivity in the range of $10^7$ to $10^{12}$ Ω per cm, formed at least over said first semiconductor region and said second semiconductor region, said high resistance film being formed directly on said first and second semiconductor regions and that portion of said semiconductor layer which surrounds said second semiconductor region; and
    means for applying a voltage across said high resistance film to create a uniform electric field in said high resistance film.

2. A planar semiconductor device acting as a conductivity modulated MOSFET, having a high breakdown voltage, comprising:
    a semiconductor layer of a first conductivity type;
    a first semiconductor region of a second conductivity type selectively formed in the surface of said semiconductor layer, said first semiconductor region having an impurity concentration higher than that of said semiconductor layer and therefore a resistivity lower than that of said semiconductor layer;
    a drain region of the first conductivity type formed in the surface of said first semiconductor region;
    a drain electrode connected to said drain region;
    a second semiconductor region of the second conductivity type formed around said first semiconductor region, said second semiconductor region having an impurity concentration lower than that of said first semiconductor region;
    a source region formed in the surface of said semiconductor layer, a predetermined distance apart from said second semiconductor region;
    a source electrode connected to said source region;
    a gate insulation film formed on the surface of that portion of said semiconductor layer which lies between said second semiconductor region and source region;
    a gate electrode formed on said gate insulation film; and
    a high resistance film having a resistivity of between $10^7$ and $10^{12}$ Ω per cm connected between said drain electrode and source electrode, and formed at least over said first semiconductor region and said second semiconductor region, said high resistance film being electrically isolated from said gate electrode by an insulation film,
    wherein the front end of that portion of said drain electrode which is connected to said high resistance is positioned at a distance of 5 to 60 μm from the boundary of said drain and first semiconductor regions toward said second semiconductor region.

3. A planar semiconductor device having a high breakdown voltage, comprising:
    a semiconductor layer of a first conductivity type;
    a first semiconductor region of a second conductivity type selectively formed in the surface of said semiconductor layer to form a pn junction together with said semiconductor layer, said first semiconductor region having an impurity concentration higher than that of said semiconductor layer and therefore a resistivity lower than that of said semiconductor layer;
    a second semiconductor region of the second conductivity type formed surrounding said first semiconductor region, said second semiconductor region forming a pn junction together with said semiconductor layer and having an impurity concentration lower than that of said first semiconductor region, said second semiconductor region having an impurity concentration of $1.5 \times 10^{12}$ to $4.5 \times 10^{12}/cm^2$ as viewed from the surface of said device;
    a third semiconductor layer of the first conductivity type formed in the surface of said semiconductor layer;
    an insulation film formed on said first, second and third semiconductor regions and the surface of said semiconductor layer between said second and third semiconductor regions;
    a high resistance film having a resistivity of between $10^7$ and $10^{12}$ Ω per cm formed on said insulation film;
    a first electrode contacted with said first semiconductor region;
    a second electrode contacted with said third semiconductor region;
    polycrystalline semiconductor films connected between said first electrode and one end portion of said high resistance film and between said second electrode and the other end portion of said high resistance film, a front end of said polycrystalline semiconductor film connected between said first electrode and one end portion of said high resistance film being positioned at a distance of 5 to 60 μm from the boundary of said first and second semiconductor regions, towards said second semiconductor region; and
    means for applying a voltage across said high resistance film to create a uniform electric field in said high resistance film.

4. A planar semiconductor device having a high breakdown voltage, comprising:
    a semiconductor layer of a first conductivity type;
    a first semiconductor region of a second conductivity type selectively formed in the surface of said semiconductor layer to form a pn junction together with said semiconductor layer, said first semiconductor region having an impurity concentration higher than that of said semiconductor layer and therefore a resistivity lower than that of said semiconductor layer;

a second semiconductor region of the second conductivity type formed surrounding said first semiconductor region, said second semiconductor region forming a pn junction together with said semiconductor layer and having an impurity concentration lower than that of said first semiconductor region, said second semiconductor region having an impurity concentration of $1.5 \times 10^2$ to $4.5 \times 10^{12}/\text{cm}^2$ as viewed from the surface of said device;

a third semiconductor layer of the first conductivity type formed in the surface of said semiconductor layer;

an insulation film formed on said first, second and third semiconductor regions and the surface of said second semiconductor layer between said second and third semiconductor regions;

a high resistance film having a resistivity of between $10^7$ and $10^{12}$ Ω per cm formed on said insulation film, and contacted with said first semiconductor region at one end and with said third semiconductor region at the other end;

a first electrode contacted with said first semiconductor region;

a second electrode contacted with said third semiconductor region; and means for applying a voltage across said high resistance film to create a uniform electric field in said high resistance film, said voltage applying means including a conductive film to which said high resistance film is electrically connected, the front end of said conductive film being positioned at a distance of 5 to 60 μm from the boundary of said first and second semiconductor regions, towards said second semiconductor region.

* * * * *